(12) United States Patent
Saito et al.

(10) Patent No.: US 6,818,546 B2
(45) Date of Patent: Nov. 16, 2004

(54) SEMICONDUCTOR INTEGRATED CIRCUIT DEVICE AND A METHOD OF MANUFACTURING THE SAME

(75) Inventors: Tatsuyuki Saito, Ome (JP); Naohumi Ohashi, Hanno (JP); Toshinori Imai, Ome (JP); Junji Noguchi, Ome (JP); Tsuyoshi Tamaru, Hachiouji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/850,162

(22) Filed: May 8, 2001

(65) Prior Publication Data

US 2001/0045651 A1 Nov. 29, 2001

(30) Foreign Application Priority Data

May 8, 2000 (JP) ........................................ 2000-135041

(51) Int. Cl.⁷ .......................................... H01L 21/4763
(52) U.S. Cl. ...................... 438/618; 438/648; 438/627; 438/624; 438/637; 438/642
(58) Field of Search ................................ 438/618, 648, 438/627, 624, 637, 642

(56) References Cited

U.S. PATENT DOCUMENTS

| | | | | |
|---|---|---|---|---|
| 4,695,327 A | * | 9/1987 | Grebinski | 134/11 |
| 5,478,436 A | * | 12/1995 | Winebarger et al. | 438/693 |
| 5,723,387 A | * | 3/1998 | Chen | 438/692 |
| 5,733,176 A | * | 3/1998 | Robinson et al. | 451/41 |
| 5,892,281 A | * | 4/1999 | Akram et al. | |
| 5,893,756 A | * | 4/1999 | Berman et al. | 438/692 |
| 5,976,975 A | | 11/1999 | Joshi et al. | |
| 6,028,362 A | * | 2/2000 | Omura | |
| 6,037,664 A | | 3/2000 | Zhao et al. | |
| 6,069,068 A | | 5/2000 | Rathore et al. | |
| 6,130,161 A | | 10/2000 | Ashley et al. | |
| 6,258,659 B1 | * | 7/2001 | Gruening et al. | |
| 6,258,710 B1 | | 7/2001 | Rathore et al. | |
| 6,261,950 B1 | | 7/2001 | Tobben et al. | |
| 6,261,953 B1 | * | 7/2001 | Uozumi | |
| 6,265,779 B1 | * | 7/2001 | Grill et al. | |
| 6,287,954 B1 | | 9/2001 | Ashley et al. | |
| 6,348,731 B1 | | 2/2002 | Ashley et al. | |
| 6,358,832 B1 | * | 3/2002 | Edelstein et al. | |

FOREIGN PATENT DOCUMENTS

| | | |
|---|---|---|
| EP | 0949673 A2 | 10/1999 |
| JP | 11-016906 | 1/1999 |

* cited by examiner

Primary Examiner—John F. Niebling
Assistant Examiner—Ron Pompey
(74) Attorney, Agent, or Firm—Antonelli, Terry, Stout & Kraus, LLP

(57) ABSTRACT

A barrier layer and a copper film are successively formed on a silicon oxide film including a groove for wiring in the silicon oxide film and a silicon nitride film, both formed on a semiconductor substrate. Thereafter, the barrier layer and the copper film are removed from outside of the groove for wiring, thereby forming a wiring. Tungsten is selectively or preferentially grown on the wiring to selectively form a tungsten film on the wiring. After the formation of the copper film, a treatment with hydrogen may be performed. After the formation of the wiring, the semiconductor substrate may be cleaned with a cleaning solution capable of removing a foreign matter or a contaminant metal. After the formation of the wiring, a treatment with hydrogen is carried out.

35 Claims, 30 Drawing Sheets

SEMICONDUCTOR INTEGRATED CIRCUIT DEVICE AND A METHOD OF MANUFACTURING THE SAME

This invention relates to a semiconductor integrated circuit device and also to a method of manufacturing the same. More particularly, the invention relates to a technique which is effective for application to wirings formed by a so-called damascene method wherein, after formation of grooves for wirings in an insulating film, a conductive film is buried inside the grooves.

BACKGROUND OF THE INVENTION

In recent years, as advances are being made in the scaling-down and multi-layered formation of wirings in a semiconductor integrated circuit device, a so-called damacene technique has been studied, as described, for example, by T. Saito et. al., in Proceedings of International Interconnect Technology Conference, 1998, pp. 160–162 and the like, in which after formation of a groove for wirings in an insulating film, a conductive film is buried inside the groove.

In Japanese laid-open patent Application No. Hei 8 (1996)-222568, a technique is described wherein a groove for wiring is formed in an insulating film and a barrier layer made of a TiN (titanium nitride) thin film is formed according to a CVD (chemical vapor deposition) method, after which a copper thin film is formed on the barrier layer and the copper thin film is etched back, followed by further formation of a protective film made of a TiN thin film and subsequent etching to leave the protective film on the resultant copper thin film wiring.

In the technical report of Mitsubishi Electric Corporation in 1997, pp333–336, a technique is described wherein a barrier layer, such as TiWN or the like, is provided on the upper surface of a copper damascene wiring.

SUMMARY OF THE INVENTION

We have recognized the following problem involved in a technique not known in the art when wirings are formed according to the so-called damascene technique wherein, after formation of a groove for wiring in such an insulating film as mentioned above, a conductive film is buried inside the groove to form a wiring.

For instance, copper is usually used as the conductive film. Copper (Cu) has a property such that, when compared with other metals, such as aluminum (Al), tungsten (W) and the like, copper is more liable to be diffused into a silicon oxide film which is being used as the insulating film. When a silicon oxide film is formed directly on the conductive film, the copper at the contact portion is oxidized, thereby permitting the wiring resistance to rise.

Accordingly, a study of the barrier layer which covers the wiring becomes important. Of the barrier films covering such wiring, a titanium nitride (TiN) film has been studied with respect to the barrier film formed inside the groove for the wiring. Likewise, silicon nitride (SiN) has been studied for use as a film (cap film) covering the upper portion of the wiring.

However, in order to prevent the diffusion and oxidation of copper by means of the silicon nitride film covering the wiring on the upper portion thereof, it is necessary that the silicon nitride film be formed to have a certain thickness. Since the silicon nitride film has a high dielectric constant, the RC time constant of the wiring becomes great, thereby impeding the high-speed operation of the device.

Electromigration may occur owing to the diffusion of copper inside the copper wiring or at the copper surface. As a result of our study on the ease of diffusion of copper, it was supposed that when a copper-barrier film interface was compared with a copper-silicon nitride film interface, the activation energy of diffusion at the copper-barrier film interface was greater (i.e. copper was more unlikely to be diffused at the copper-barrier film interface). Accordingly, the electromigration life is determined by the activation energy value of diffusion of copper at the copper-silicon oxide film interface.

Where an upper wiring is further formed on the copper wiring through an insulating film, wherein the copper wiring and the upper wiring are connected with each other through a plug formed in the insulating film, the silicon nitride film over the copper wiring has been removed so as to permit contact, under which the bottom surface of the plug is in direct contact with the copper of the lower wiring. This is liable to cause the concentration of an electric current through the current path from the plug bottom to the lower copper wiring, thereby causing electromigration to occur. Moreover, when voids are formed beneath the plug due to the influence of electromigration, the area of contact between the plug and the lower copper wiring becomes small, thereby leading to the accelerated lowering of the wiring life.

When the plug is formed, a contact hole is also made. In this case or when the contact hole is etched at the bottom thereof so as to improve the contact characteristic, the copper wiring per se at the bottom of the contact hole is also sputter-etched. This allows copper to be deposited on the side walls of the contact hole. As set out hereinabove, such copper is liable to be diffused in the insulating film, thus bringing about a lowering of the breakdown voltage and an increased leakage current.

For burying the conductive film in the groove for wiring, a copper film is, for example, formed on the insulating film, including the inner portion of the groove for wiring, followed by removal of an additional copper film outside the group by chemical mechanical polishing (CMP). At that time, it may be inevitable that recesses or other defects occur. Thereafter, when a silicon nitride film is formed on the copper wiring, voids are formed at the defective portions, with the possibility that electromigration is undesirably caused to start from the void.

Further, where a mask for the contact hole is shifted relative to the lower copper wiring, a fine recess may occur at a side portion of the lower wiring. It is difficult to bury a plug in such a fine recess, thus leading to the formation of a void like that of the above case, with the possibility of creating a starting point for electromigration. In this case, because an area of contact between the plug and the lower wiring is reduced owing to the shifting of the mask, under which condition, when the void is moved toward the interface of the contact, the connection between the plug and the lower wiring is not ensured, resulting in a connection failure.

It is accordingly an object of the invention to provide a semiconductor integrated circuit device and a method of manufacture thereof wherein a cap conductive film is formed on a wiring, thereby realizing high speed operation of the device.

It is another object of the invention to provide a semiconductor integrated circuit device and a method of manufacture thereof wherein an elongated wiring life is ensured, while suppressing electromigration and stress migration from occurring.

It is a further object of the invention to provide a semiconductor integrated circuit device and a method of manufacture thereof wherein the device has an improved dielectric breakdown and has a reduced leakage current achieved by preventing direct sputtering of an underlying copper wiring when a contact hole is etched at the bottom thereof.

It is a still further object of the invention to provide a semiconductor integrated circuit device and a method of manufacture thereof wherein contact failure is reduced even if a contact hole is shifted relative to a wiring.

The above objects and novel features of the invention will become more apparent from the description provided in this specification and from the accompanying drawings.

Typical embodiments of the invention are summarized below.

The method of manufacture of a semiconductor integrated circuit device according to the invention comprises successively forming a barrier layer and a conductive layer within a groove for wiring, removing the barrier layer and the conductive film from outside of the groove for wiring to form the wiring, and forming a cap conductive film on the wiring by selective or preferential growth.

When the cap conductive film is formed on the wiring by selective or preferential growth in this way, the formation of the cap conductive film becomes easy, thus making it possible to realize a high-speed semiconductor integrated circuit device. Moreover, the occurrence of electromigration or stress migration can be suppressed, while providing an elongated wiring life. When a contact hole formed on the wiring is etched at the bottom thereof, direct sputtering of the underlying wiring can be prevented. Thus, dielectric breakdown is reduced, and the reduction of leakage current can be realized. In addition, even when the contact hole is shifted relative to the wiring, the required contact can be maintained and contact failure can be reduced.

The wiring is made, for example, of copper (Cu), silver (Ag), aluminum (Al) or an alloy comprising the above-mentioned metal or metals as a main component. For the cap conductive film, a tungsten (W) film is used, for example. The cap conductive film may be a film of tungsten nitride (WN), titanium nitride (TiN), tantalum (Ta), tantalum nitride (TaN) or nickel (Ni). The cap conductive film can be formed at a pressure of 1 Torr ($1\times1.33322\times10^2$ Pa) or below.

An insulating film on the cap conductive film may be formed of a laminated film consisting of a TEOS (tetraethylorthosilicate) film or a carbon-containing silicon insulating film and a film having a dielectric constant lower than the above-mentioned film. Alternatively, the insulating film on the cap conductive film may be formed of a diffusion-preventing insulating film for preventing diffusion of a conductor material for the conductive film and a low dielectric insulating film. For the diffusion-preventing insulating film, there may be used, for example, a silicon nitride film, a PSG film, a silicon carbide film or the like. For the low dielectric insulating film, there is, for example, a TEOS film or an SIOF film.

Prior to the formation of the cap conductive film, the substrate surface may be cleaned with a solution containing hydrogen fluoride or the like for removing foreign matter or contaminated metal. Alternatively, prior to the formation of the cap conductive film, the substrate surface may be treated with hydrogen. After the formation of the cap conductive film, the substrate surface may be cleaned with a solution containing hydrogen fluoride (HF) or hydrogen peroxide ($H_2O_2$).

As a result of these treatments, a highly reliable cap conductive film can be formed.

The semiconductor integrated circuit device of the invention comprises a barrier layer formed at side walls and at the bottom of a groove for wiring, a conductive film formed on the barrier layer, and a cap conductive film formed on the conductive film.

The formation of the cap conductive film on the conductive film (wiring) in this way ensures the provision of a high-speed semiconductor integrated circuit device. Moreover, the occurrence of electromigration or stress migration can be suppressed, resulting in an elongation of the life of the wiring. In addition, when a contact hole formed on the wiring is etched at the bottom thereof, the direct sputtering of the underlying wiring can be prevented, thus realizing an improvement including reduction of the dielectric breakdown and reduction of the leakage current. If the contact hole is shifted relative to the wiring, the required contact still can be maintained, and thus, the number of contact failures can be reduced.

It will be noted that the wiring is made, for example, of copper, silver, aluminium or an alloy containing these metals as a main component. The cap conductive film is, for example, a W film. The cap conductive film may be a film of WN, TiN, Ta, TaN or Ni. Alternatively, the cap conductive film may be a film which is formed by selective growth or preferential growth, or may be a film which is formed at a pressure of 1 Torr ($1\times1.33322\times10^2$ Pa) or below. The thickness of the cap conductive film should be uniform within the same plane of the wiring and can be made uniform irrespective of the wiring width. The variation of the thickness of the cap conductive film may be within a range of 50% or below. Moreover, the thickness of the cap conductive film can be made thinner than the barrier layer at the bottom of the groove for wiring. More particularly, the thickness of the cap conductive film ranges, for example, from 2 to 20 nm.

The insulating film on the cap conductive film may be made of a laminated film including a TEOS film or a carbon-containing silicon insulating film and a film whose dielectric constant is lower than the first-mentioned one. Alternatively, the insulating film on the cap conductive film may be made of a diffusion-preventing insulating film for preventing diffusion of a conductor material for the conductive film, and a low dielectric insulating film. For the diffusion-preventing insulating film, there is used, for example, a silicon nitride film, a PSG film or a silicon carbide film. For the low dielectric insulating film, there is used, for example, a TEOS film or an SiOF film.

BRIEF DESCRIPTION OF THE DRAWINGS

FIGS. 28a, 287b and 28c are, respectively, sectional views illustrating effects concerning Embodiments 5 and 6 of the invention;

DETAILED DESCRIPTION OF THE PREFERRED EMBODIMENTS

Figure 1A:
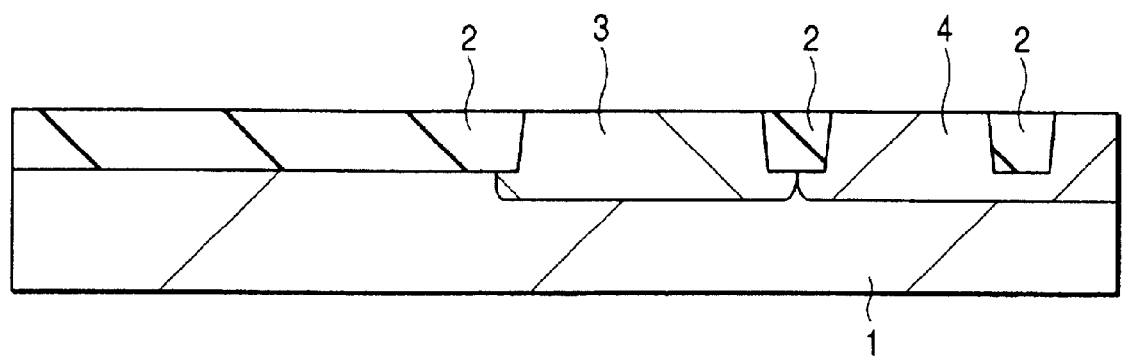
FIGS. 1a and 1b are, respectively, sectional views showing steps in the manufacture of a semiconductor integrated circuit device according Embodiment 1 of the invention.

Embodiments of the invention will be described in detail with reference to the accompanying drawings. It should be noted that like reference numerals indicate like members throughout the drawings illustrating the various embodiments and such elements may not be repeatedly described.

(Embodiment 1)

FIGS. 1a to 11 are, respectively, sectional views showing the successive steps of a method of manufacture of a semiconductor integrated circuit device according to Embodiment 1 of the invention.

As shown in FIG. 1a, a semiconductor substrate 1 is made, for example, of p-type single crystal silicon, and an element isolation region 2 is formed on the main surface of the semiconductor substrate 1. For the formation of the element isolation region 2, the semiconductor substrate 1 is etched at the element isolation region thereof to form an approximately 350 nm thick groove, followed by thermal oxidation of the semiconductor substrate 1 at about 850 to 1000° C. to form an approximately 10 nm thick silicon oxide film (not shown) on the inner walls of the groove. Next, a silicon oxide film having a thickness of approximately 45 to 500 nm is deposited on the semiconductor substrate 1, including the inside of the groove, according to a CVD method. Thereafter, the silicon oxide film outside the groove is removed by CMP to flatten the surface.

Thereafter, a p-type impurity (e.g. boron (B)) and an n-type impurity (e.g. phosphorus (P)) are, respectively, ion-implanted into the semiconductor substrate 1, and the semiconductor substrate is thermally treated at about 950° C. to diffuse the impurities, thereby forming a p-type well 3 and an n-type well 4.

Figure 1B:
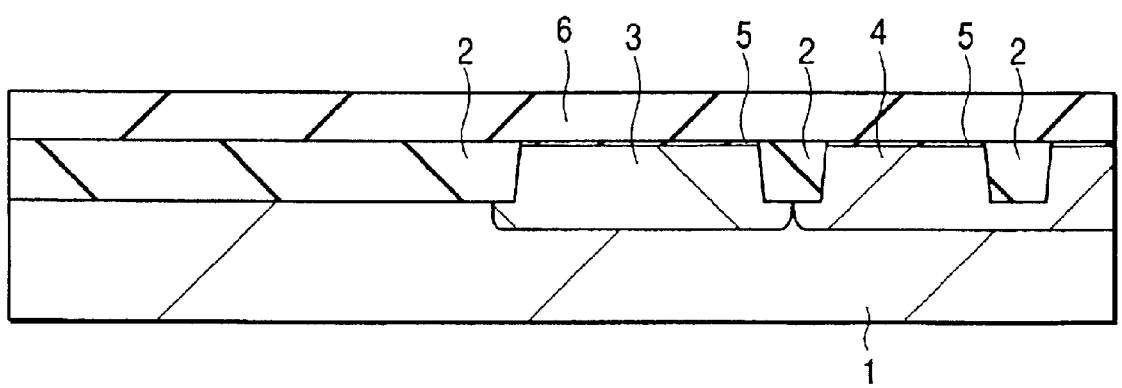

Subsequently, as shown in FIG. 1b, the semiconductor substrate 1 is cleaned on the surface thereof by wet etching using, for example, hydrofluoric acid, and it is subsequently thermally oxidized at about 800 to 850° C. to form a clean gate oxide film 5 having a thickness of approximately 7 nm on the surface thereof.

Figure 2A:
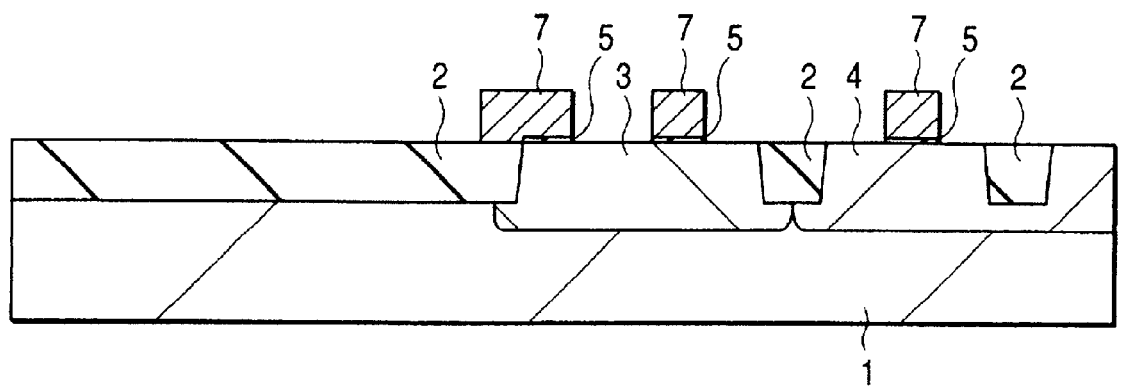
FIGS. 2a and 2b are, respectively, sectional views showing steps in the manufacture of a semiconductor integrated circuit device according Embodiment 1 of the invention.

Next, a polysilicon film 6 is, for example, formed and etched to form a gate electrode 7, as shown in FIG. 2a. At the time, an n-type impurity (e.g. phosphorus) is injected into the polysilicon 6 on the p-type well 3, and a p-type impurity (e.g. boron) is injected into the polysilicon 6 on the n-type well 4, thus making it possible to provide a so-called dual gate structure wherein the gate electrode of the n-channel MISFET is of the n type and the gate electrode of the p-channel MISFET is of the p-type. The adoption of the dual gate structure enables one to lower the threshold value (Vth) of the MISFET and drive the MISFET at a low voltage.

Figure 2B:
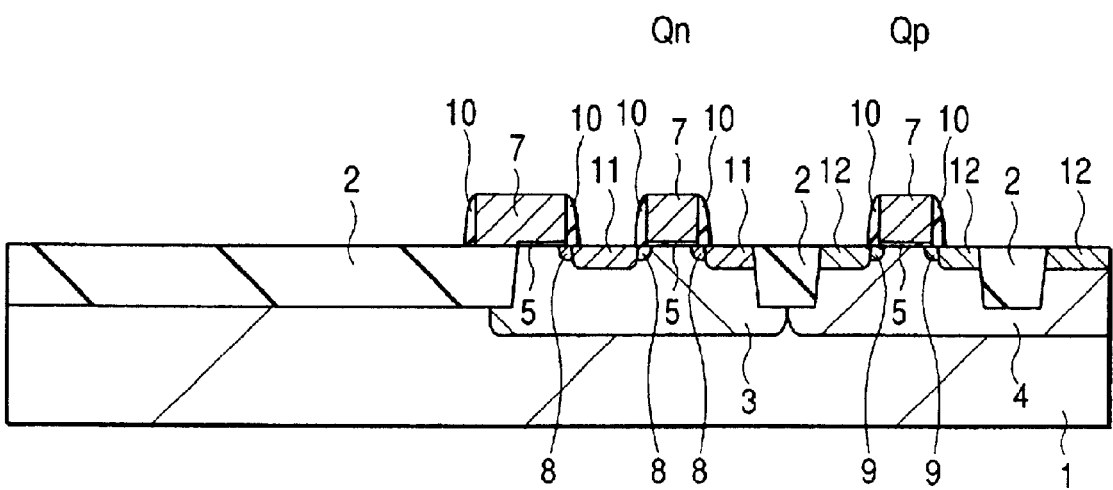

Thereafter, as shown in FIG. 2b, an n-type impurity (phosphorus (P) or arsenic (As)) is ion-implanted into the semiconductor substrate 1 at opposite sides of the gate electrode 7 on the p-type well 3, thereby forming n-type semiconductor regions 8 (source, drain). Likewise, a p-type impurity (e.g. boron) is ion-implanted into the semiconductor substrate 1 at opposite sides of the gate electrode 7 on the n-type well 4, thereby forming p-type semiconductor regions 9 (source, drain).

Subsequently, a side wall 10 is formed on side walls of the gate electrode 7. The side wall 10 is formed by depositing an approximately 50 to 100 nm thick silicon nitride film, serving as an insulating film, on the semiconductor substrate 1 by a CVD method and anisotropically etching the silicon nitride film. The insulating film may be constituted of a silicon oxide film.

While using the gate electrode 7 and the side wall 10 as a mask (i.e. in a self-aligned way), an n-type impurity (phosphorus or arsenic) is ion-implanted into the p-type well 3 to form $n^+$-type semiconductor regions 11 (source, drain), and a p-type impurity (boron) is ion implanted into the n-type well 4 to form $p^+$-type semiconductor regions 12 (source, drain). According to these steps, as set out hereinabove, there can be obtained an n-channel MISFETQn and a p-channel MISFETQp, each provided with a source and drain having an LDD (lightly doped drain) structure.

Figure 3A:
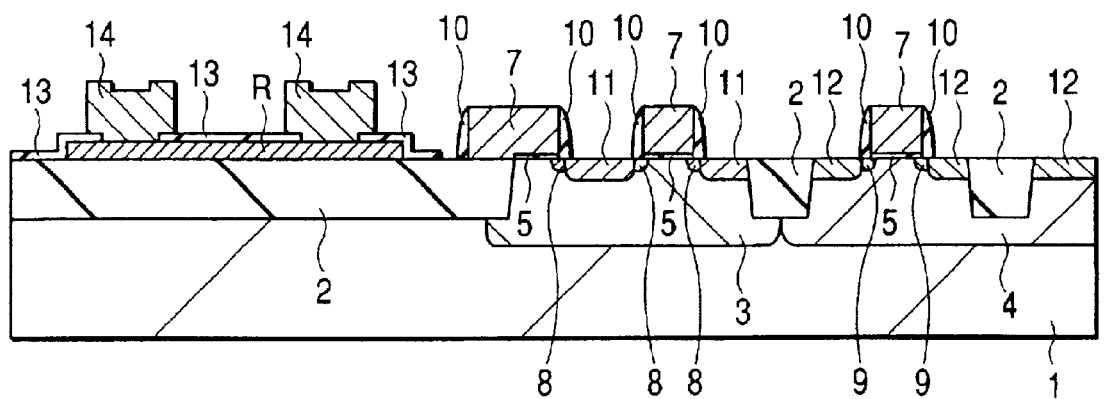
FIGS. 3a and 3b are, respectively, sectional views showing steps in the manufacture of a semiconductor integrated circuit device according Embodiment 1 of the invention.

Next, as shown in FIG. 3a, a resistor element is formed on the wide element isolation region 2. This resistor element includes a conductor film R, an insulating film 13 covering the conductor film R and a lead electrode 14 on the insulating film 13, and it is formed in the following manner. For instance, a conductor film, such as polysilicon or the like, into which an impurity is introduced in a reduced amount, is deposited over the entire surface of the semiconductor substrate 1, followed by patterning to form the conductor film R. This conductor film R may be made, aside from the semiconductor film such as polysilicon film, of a metal film, such as tungsten or the like.

Next, an insulating film 13, such as a silicon oxide, a silicon nitride film or the like, is deposited on the conductor film R by a CVD (chemical vapor deposition) method or a sputtering method.

Further, part of the insulating film 13 is etched to form a connection hole, and a polysilicon film is deposited on the insulating film 13 including the inside of the connection hole by the CVD method, followed by patterning the polysilicon film to be left on the upper portion of the connection hole, thereby forming a lead electrode 14.

Thereafter, a high melting point metal film (not shown), such as titanium or the like, is formed over the entire surface of the semiconductor substrate 1. Such a film may be made, aside from titanium, of a metal such as tungsten, cobalt or the like.

Figure 3B:
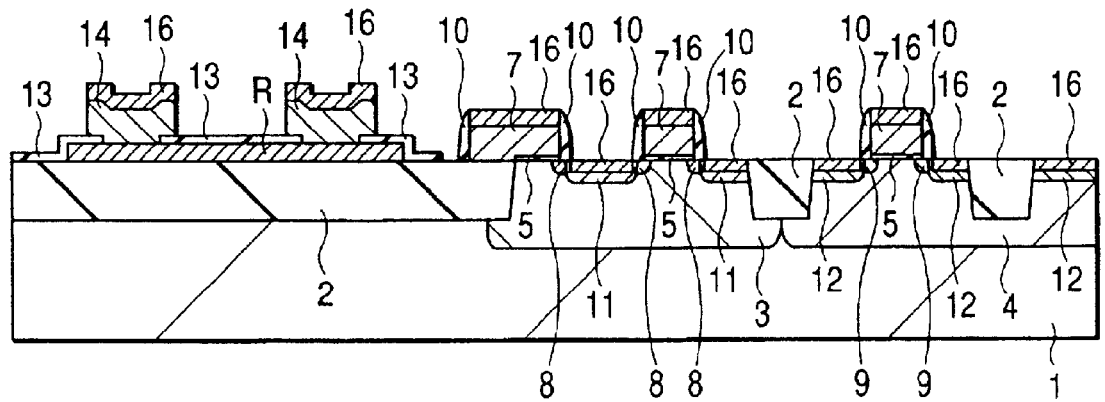

As shown in FIG. 3b, the semiconductor substrate 1 is subjected to thermal treatment by an RTA (rapid thermal annealing) method to form a silicide layer 16 at portions between the high melting point metal film and the gate electrode 7 and also between the lead electrode 14 and the semiconductor substrate 1. Subsequently, the unreacted high melting point metal film is removed. Since these silicide layers 16 are formed, the connection resistance between the silicide layer 16 and a plug 21 or the like formed on the upper portion of the silicide layer 16, to be described hereinafter, can be reduced. In addition, the sheet resistance of the gate electrode 7 and the $n^+$-type semiconductor region 11 or $p^+$-type semiconductor region 12 per se can be reduced.

Figure 4A:
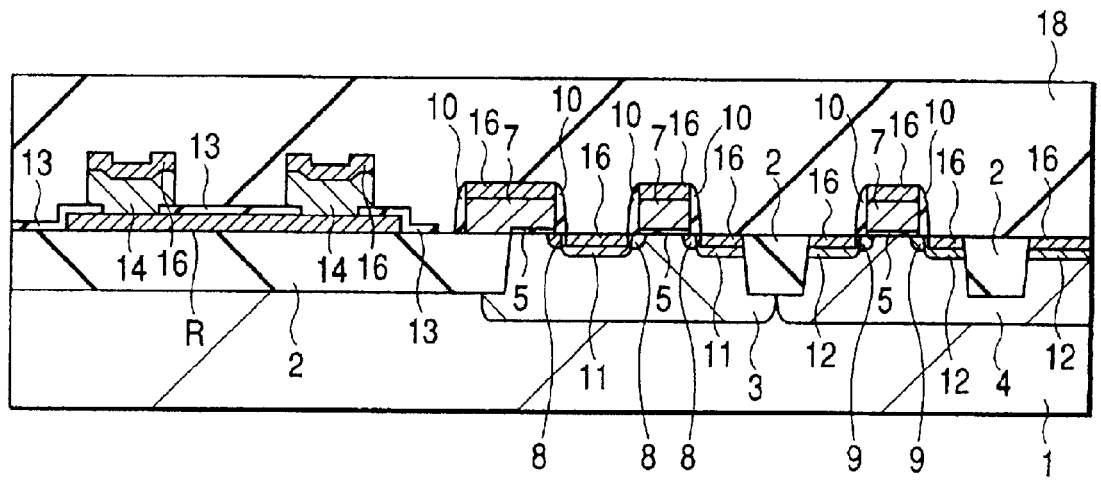
FIGS. 4a and 4b are, respectively, sectional views showing steps in the manufacture of a semiconductor integrated circuit device according Embodiment 1 of the invention.

As shown in FIG. 4a, a silicon oxide film is deposited by the CVD method to form an interlayer insulating film 18. The interlayer insulating film 18 may be made of a PSG (phosphor silicate glass) or an SOG (spin on glass) film. The interlayer insulating film 18 may be flattened on the surface thereof by CMP. In this embodiment, the interlayer insulating film 18 is flattened by CMP on the surface thereof.

Figure 4B:
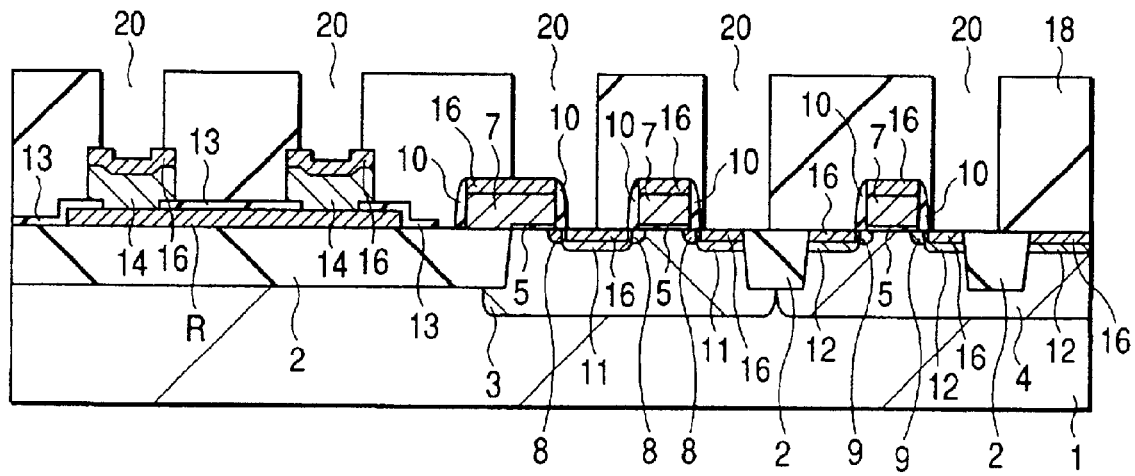

As shown in FIG. 4b, the interlayer insulating film 18 is removed by etching from the $n^+$-type semiconductor region 11 or $p^+$-type semiconductor region 12 and also from the silicide layer 16 constituting the resistor element R, thereby forming a contact hole 20.

Figure 5A:
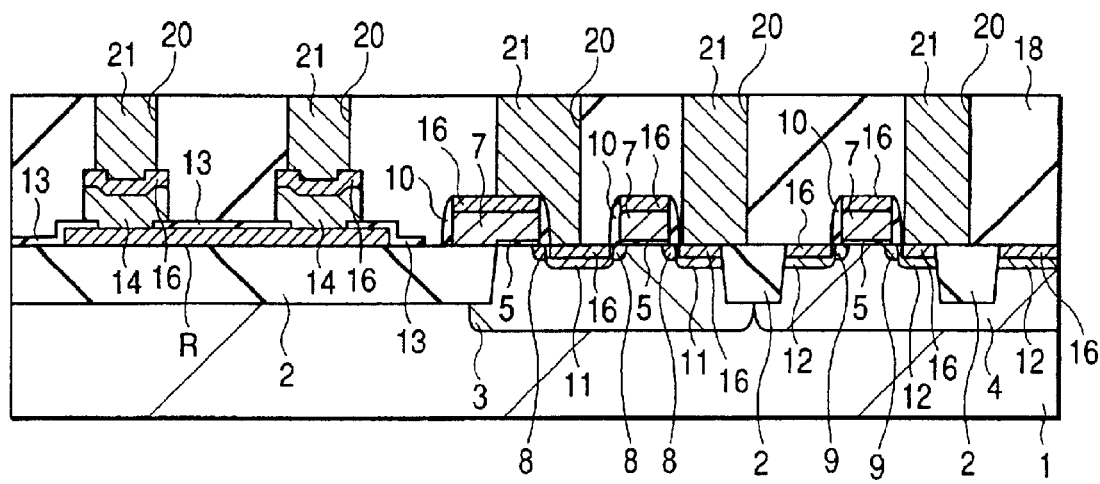
FIGS. 5a and 5b are, respectively, sectional views showing steps in the manufacture of a semiconductor integrated circuit device according Embodiment 1 of the invention.

Next, as shown in FIG. 5a, a titanium nitride film (not shown) is formed, by the CVD method, on the interlayer insulating film 18 including the contact hole 20, followed by further formation of a tungsten (W) film (i.e. a first conductive film defined in claim 3). Next, the titanium nitride film (TiN) and the tungsten film are removed by CMP from portions other than the contact hole 20. It will be noted that the titanium nitride film may be formed by a sputtering method. The titanium nitride film may be formed of a laminated film consisting of titanium (Ti) and titanium nitride (TiN).

Figure 5B:
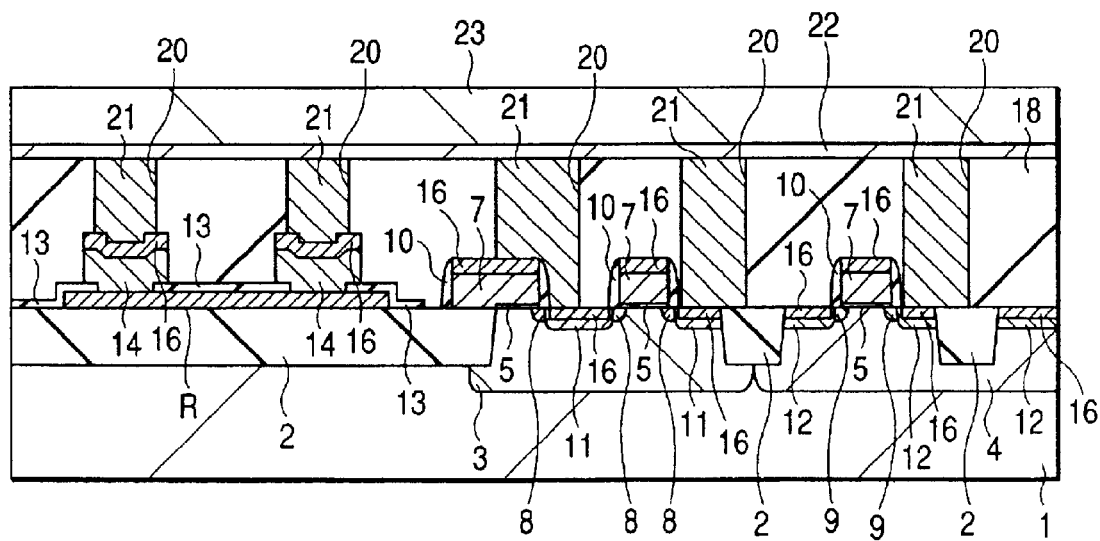

As shown in FIG. 5b, a silicon nitride film 22 is formed over the interlayer insulating film 18 and the plug 21, followed by further deposition of a silicon oxide film 23 by the CVD method.

Figure 6A:
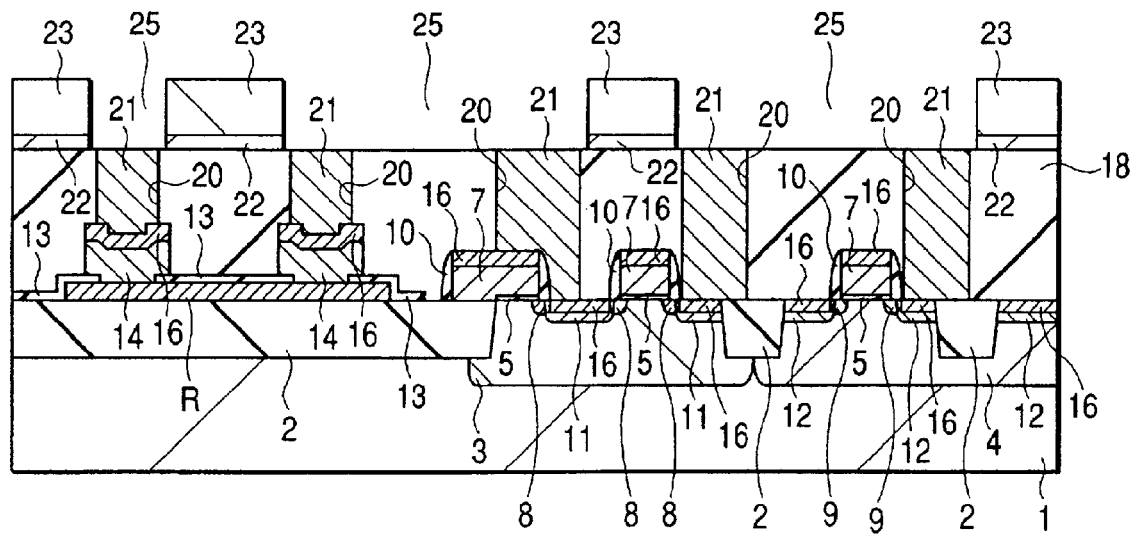
FIGS. 6a and 6b are, respectively, sectional views showing steps in the manufacture of a semiconductor integrated circuit device according Embodiment 1 of the invention.

As shown in FIG. 6a, the silicon oxide film 23 is removed by etching from a region where a first wiring is to be formed, and the silicon nitride film 22 exposed by the etching is further etched to form a groove 25 for wiring. Accordingly, the etching of the silicon oxide film 23 is performed under conditions where the silicon nitride film 22 is unlikely to be etched and the silicon oxide film 23 is likely to be etched. Thereafter, etching is carried out under conditions where the silicon nitride film 22 is likely to be etched. In this way, the silicon nitride film 22 is used as an etching stopper. In a case where the degree of etching can be controlled, such as by time, the silicon oxide film 23 may be formed directly on the silicon oxide film 18 without formation of the silicon nitride film 22.

Figure 6B:
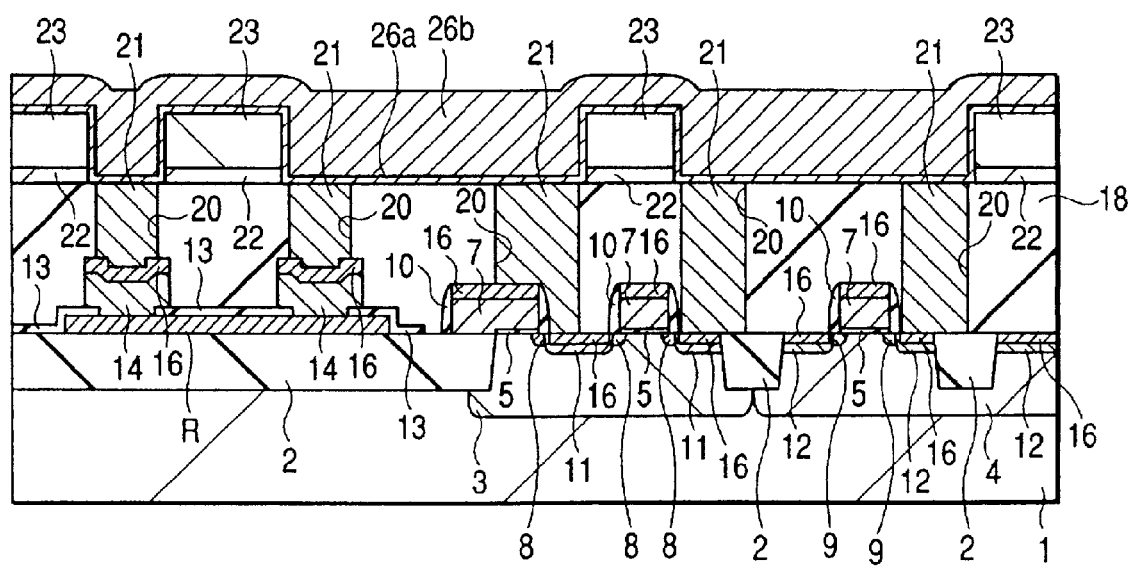

Subsequently, as shown in FIG. 6b, a barrier layer 26a made of titanium nitride is deposited on the silicon oxide film 23 including the groove 25 for wiring by a sputtering method or a CVD method. A copper film 26b (i.e. a conductive film) is formed (or attached) on the barrier layer 26a by a sputtering method. More particularly, a 0.4 $\mu$m thick copper film 26b is formed at a flat portion under conditions, which include a distance between a target and a wafer of 300 mm, a film-forming pressure of 0.2 mTorr ($0.2\times1.33322\times10^{-1}$ Pa) or below, a film-forming initial temperature of 20° C., and a final arrival temperature of 300° C., followed by annealing in a reductive atmosphere, or by treating in an atmosphere of hydrogen under conditions, for example, of 15 Torr ($15\times1.33322\times10^2$ Pa) and 430° C. for 2 minutes. The annealing in hydrogen is effected so as to reduce the oxide layer on the surface of the copper film and fluidize the copper film, thereby improving a burying characteristic of the copper in the wiring groove. The hydrogen (annealing) treatment leads to an improved quality of the copper film, and thus, the Cu wiring can be improved in reliability. It will be noted that the copper film may be formed (or attached) by an electroplating method. In this case, after formation of a thin copper film by a sputtering method, a metallic deposit may be grown while using a thin film, such as a seed film. When the copper film deposited by plating is treated (annealed) with hydrogen, the copper film 26b can be improved in quality, thereby improving the reliability of the Cu wiring 26. The barrier layer 26a may be made not only of titanium nitride, but also a single-layered film such as of tantalum (Ta), tantalum nitride (TaN), tungsten (W) or tungsten nitride (WN). Alternatively, there may be used, aside from a three-layered laminated film obtained by forming a titanium nitride film formed on a titanium film and further forming a titanium film (Ti/TiN/Ti), laminated films of Ti/TiN, Ta/TaN/Ta, Ta/TaN and the like.

Figure 7A:
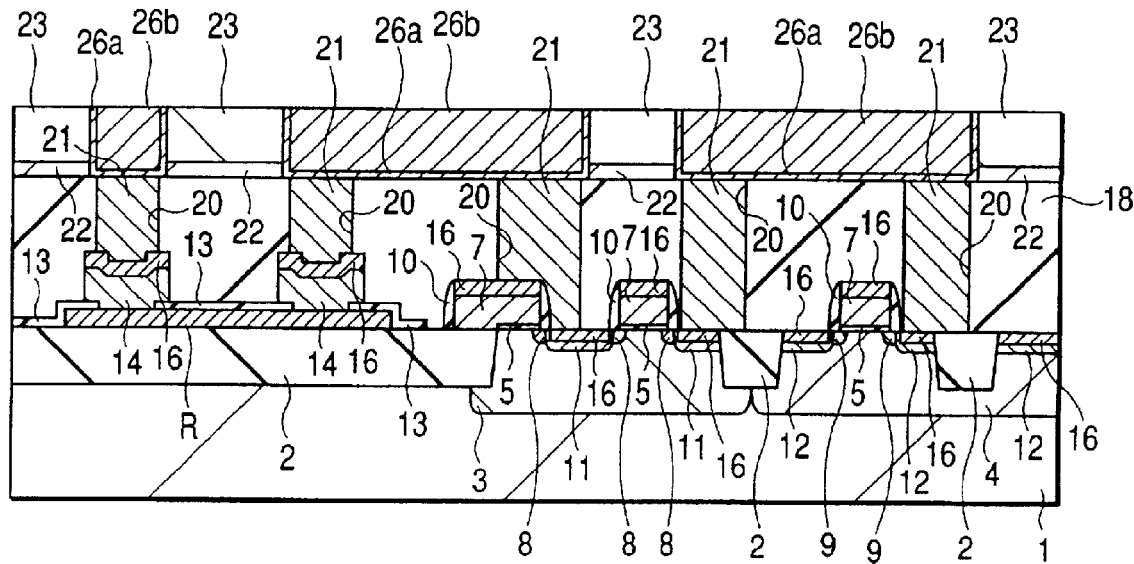
FIGS. 7a and 7b are, respectively, sectional views showing steps in the manufacture of semiconductor integrated circuit device according Embodiment 1 of the invention.
Figure 7B:
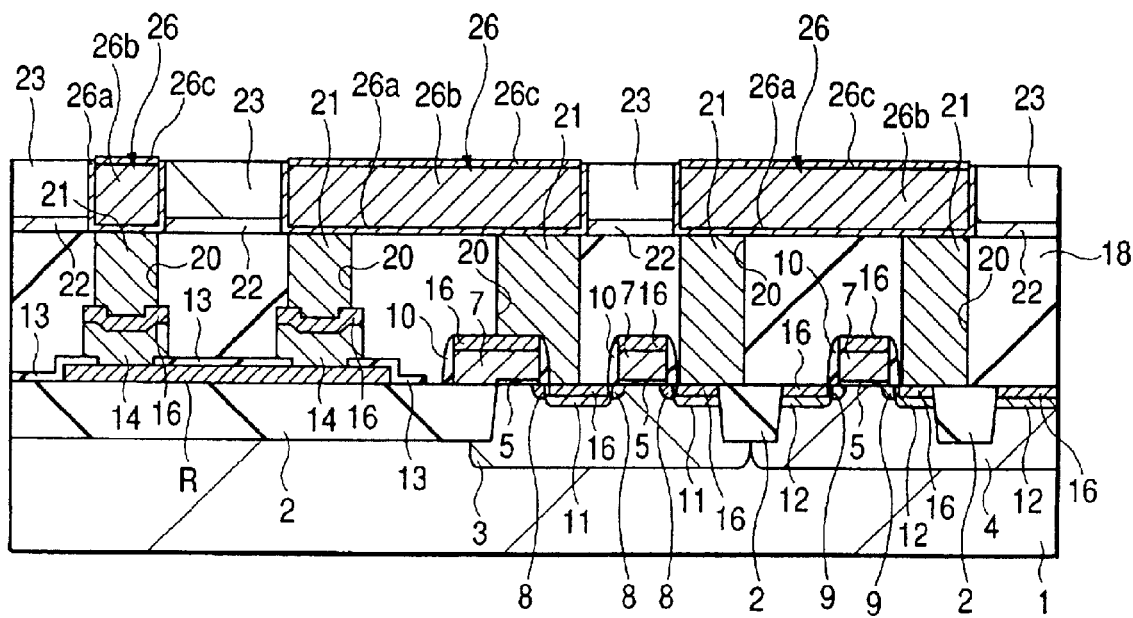

Next, as shown in FIG. 7a, the copper film 26b and the titanium nitride film 26a are, respectively, removed from the outside of the groove 25 for wiring by CMP to form a wiring 26.

Thereafter, tungsten is selectively or preferentially grown on the wiring 26 to form an approximately 2 to 20 nm thick tungsten film 26c (i.e. a cap conductive film) on the wiring 26 (i.e. the copper film 26b). The tungsten film 26c is formed under conditions, for example, of 0.3 Torr ($0.3 \times 1.33322 \times 10^2$ Pa), a preset temperature of 460° C., a flow rate of tungsten hexafluoride ($WF_6$) of 5 scc., and a flow rate of hydrogen ($H_2$) of 500 scc., for 1.5 minutes.

By the foregoing treatment, tungsten is selectively grown only on the wiring 26, or tungsten is preferentially grown on the wiring 26 in comparison with the silicon oxide film 18.

It will be noted that the selective growth or preferential growth can be achieved by the CVD method or plating method. When the film is formed by the CVD method, the conditions therefor include those of a film-forming pressure of 2 Torr ($2 \times 1.33322 \times 10^2$ Pa) or below, a temperature of 250° C., and a ratio in flow rate between tungsten hexafluoride ($WF_6$) and hydrogen, $WF_6/H_2$, of 1/50 or below.

Aside from tungsten, there may be used, as the cap conductive film on the wiring 26, a TiN, Ta, TaN, WN or Ni film. The resistance of tungsten ranges from 5 to 20 $\mu\Omega\cdot cm$, which is smaller than a resistance of TiN of 80 to 150 $\mu\Omega\cdot cm$, so that the use of tungsten film ensures good contact at a low resistance.

Thus, according to this embodiment, since tungsten is formed on the wiring 26 by selective growth or preferential growth, the wiring 26 is not directly in contact on the upper surface thereof with the insulating films, such as the silicon nitride film and the silicon oxide film, but is in contact with the tungsten film 26c that is made of the same metal as the wiring, thereby permitting electromigration to be reduced. As stated hereinbefore, this is assumed for the reason that, when comparing the interface between the copper and the barrier film with the interface between the copper and the silicon nitride film, the activation energy of diffusion is greater for the interface between the copper and the barrier film (i.e. copper is more unlikely to be diffused). Thus, the wiring life can be improved.

The wiring 26 is covered at the side faces and bottom face thereof with the barrier layer 26a and at the upper face thereof with the tungsten film 26c. Thus, the wiring is covered wholly with hard metals, and thus, the breakage of the wiring or the like ascribed to stress migration can be prevented. As a result, the wiring life can be improved.

Figure 22A:
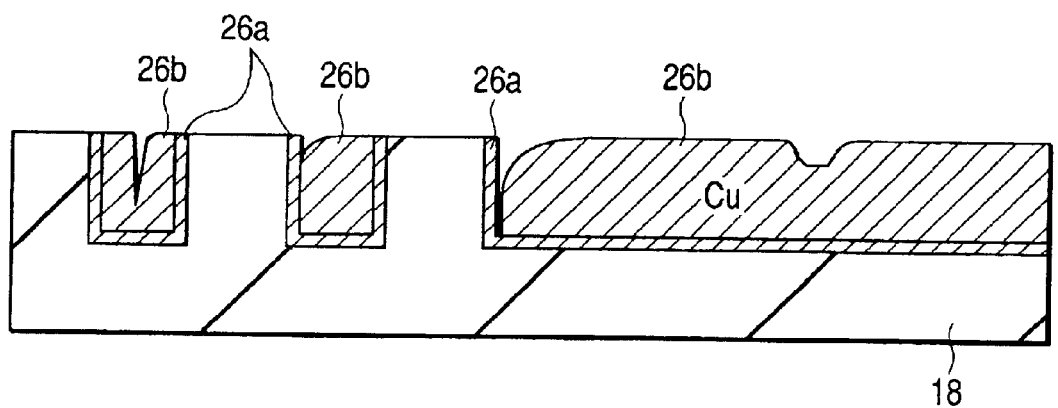
FIGS. 22a and 22b are, respectively, sectional views illustrating the effects of the invention.
Figure 22B:
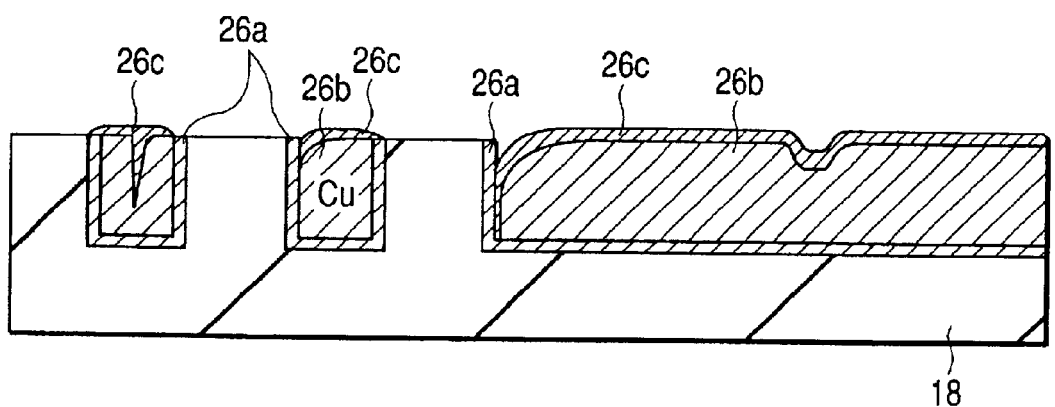

Even if a burying failure occurs in a case where the copper film 26b is buried in the wiring groove 25, or if breakage, shrinkage or scratches are caused in the surface of the wiring 26 by CMP or a subsequent thermal treatment at the time of the formation of the wiring 26 (FIG. 22a), the formation of the tungsten film 26c on the surface of the wiring covers the defective portions, such as a breakage, thereby permitting the defects to be repaired (FIG. 22b). It will be noted that FIG. 22a is a schematic view showing the case where a defect appears in the wiring 26, and FIG. 22b is a schematic view showing the state after the tungsten film has been selectively or preferentially grown on the wiring shown in FIG. 22a.

As stated hereinabove, the growth of an approximately 2 to 20 nm thick tungsten film is possible at a relatively low pressure (1 Torr ($1 \times 1.33322 \times 10^2$ Pa) or below), and thus, the coverage on the surface of the wiring 26 is good, enabling small defects to be repaired.

These defects cause voids to occur, and electromigration is induced from such a void as a starting point, so that the repairing of the defect results in a reduction of the electromigration. Eventually, the wiring life can be improved.

Figure 8A:
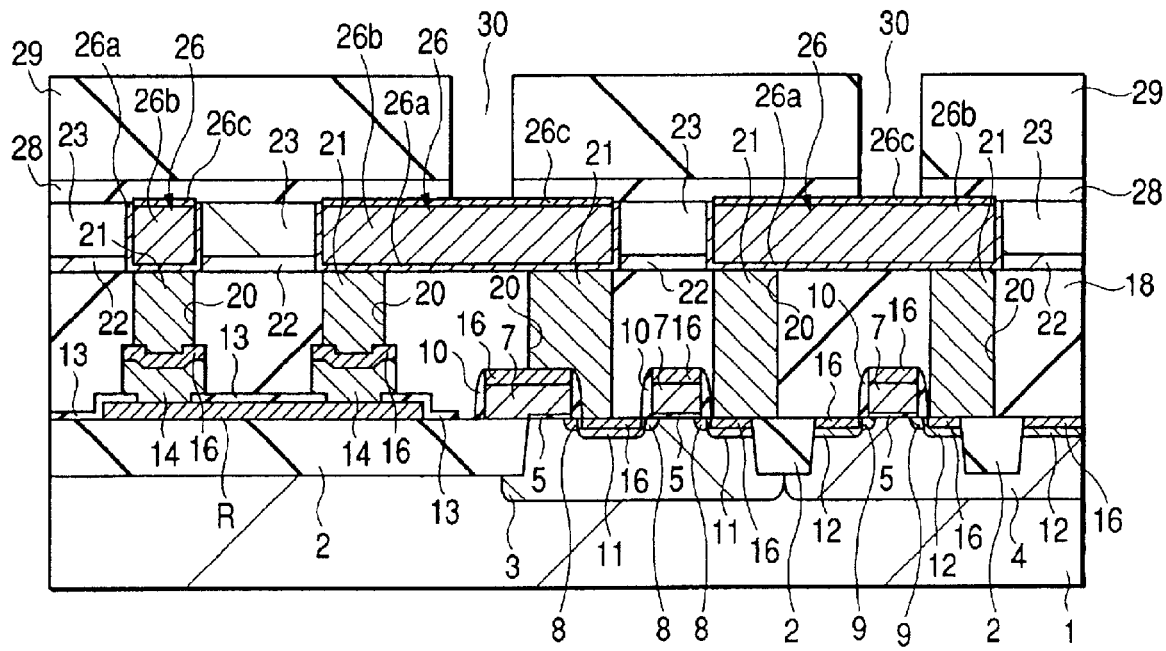
FIGS. 8a and 8b are, respectively, sectional views showing steps in the manufacture of a semiconductor integrated circuit device according Embodiment 1 of the invention.

Next, as shown in FIG. 8a, a silicon nitride film 28 is formed on the silicon oxide film 23 and the wiring 26 (tungsten film 26c), followed by further deposition of a silicon oxide film 29 by a CVD method.

Thereafter, the silicon oxide film 29 on the contact region of the wiring 26 is removed by etching, and the silicon nitride film 28 exposed by the etching is further etched to form a contact hole 30. Accordingly, the etching of the silicon oxide film 29 should be effected under conditions where the silicon nitride film 28 is unlikely to be etched and the silicon oxide film is apt to be etched. Thereafter, the silicon nitride film 28 is etched under conditions where it is likely to be etched. In this way, the silicon nitride film 28 is utilized as an etching stopper, and where the degree of etching can be controlled, such as by time, the silicon oxide film 29 may be formed directly on the silicon oxide film 23 and the wiring 26 without formation of the silicon nitride film 28. It will be noted that where no silicon nitride film is used, the capacitance between the wirings can be reduced, resulting in the high-speed circuit operation.

Figure 23A:
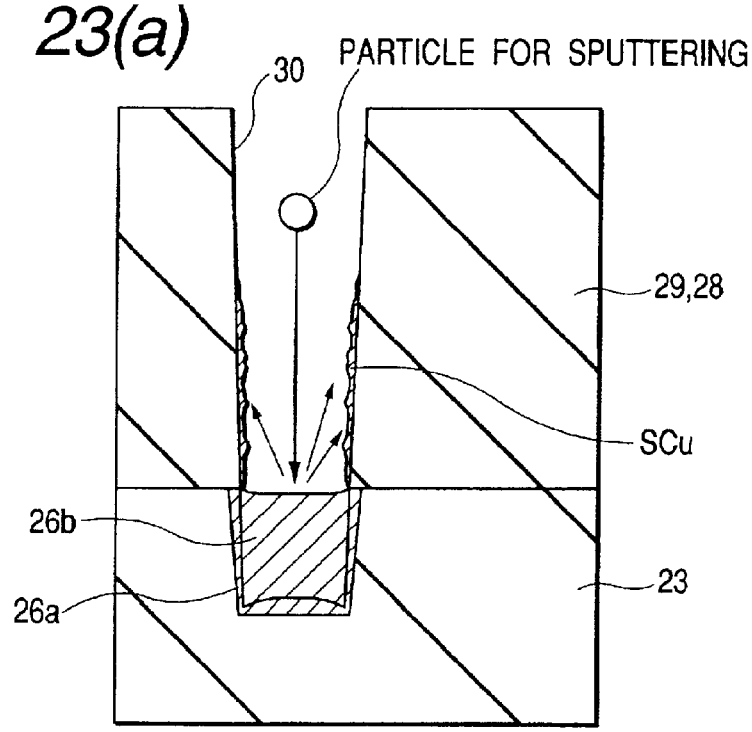
FIGS. 23a and 23b are, respectively, sectional views illustrating the effects of the invention.
Figure 23B:
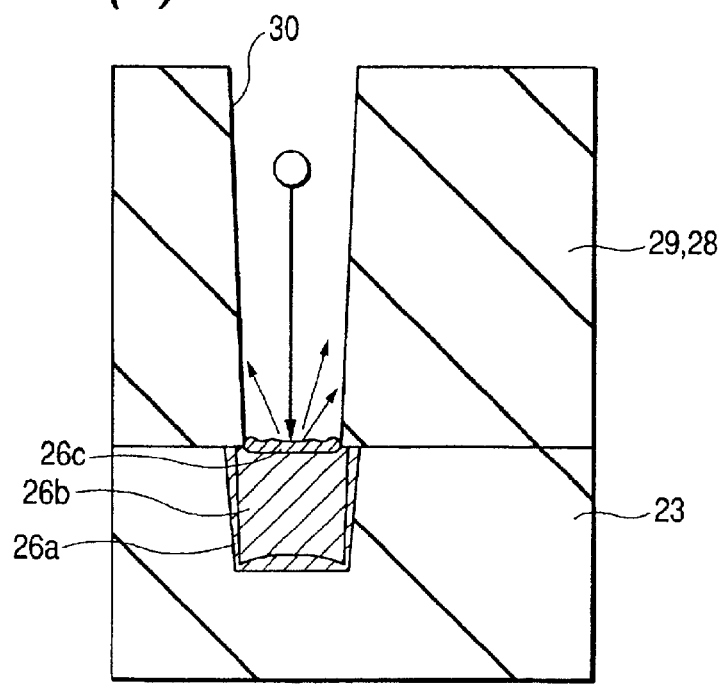

For the formation of the contact hole 30 or for the etching of the contact hole at the bottom thereof, as will be described hereinafter, the lower wiring 26 is covered with the tungsten film 26c whose surface is hard, so that copper is prevented from scattering at the time of sputtering etching. More particularly, where the tungsten film 26c is not formed, the wiring surface is etched in the manner particularly shown in FIG. 23a, and the scattered copper (SCu) is attached at the side of the contact hole 30. In contrast, with the embodiment of the invention where the lower wiring 26 is covered with the tungsten film 26c whose surface is hard, copper is prevented from scattering, as shown in FIG. 23b. Accordingly, a contaminated layer of copper is not formed at the lower portion of the barrier layer, as will be described hereinafter, and thus, contamination of the silicon oxide film (insulating film) with copper can be prevented.

The use of selective growth or preferential growth permits the tungsten film 26c to be readily formed on the surface of the wiring 26 (copper film 26b). When using the selective growth or preferential growth, the tungsten film 26c can be formed relatively uniformly irrespective of the wiring width. Moreover, the film thickness can be made relatively uniform (with a variation of 50% or below) throughout the wiring including the end and central portions thereof. When using selective or preferential growth, the tungsten film 26c at the surface of the wiring 26 can be formed more thinly than the barrier layer 26a (especially, at the bottom thereof) covering the side walls and bottom of the wiring, thereby ensuring a good contact characteristic with the upper wiring.

The silicon nitride film 28 on the surface of the wiring 26, which has been hitherto studied, is at least partially replaced by the tungsten film, so that the silicon nitride film 28 for preventing the diffusion of copper, which has a high dielectric constant and impedes high-speed operation, can be reduced in amount or disused, thus resulting in high-speed operation of the device. More particularly, when comparing this with the case using no tungsten film 26c, the silicon nitride film 28 can be reduced in thickness, ensuring high-speed operation of the device.

Figure 24A:
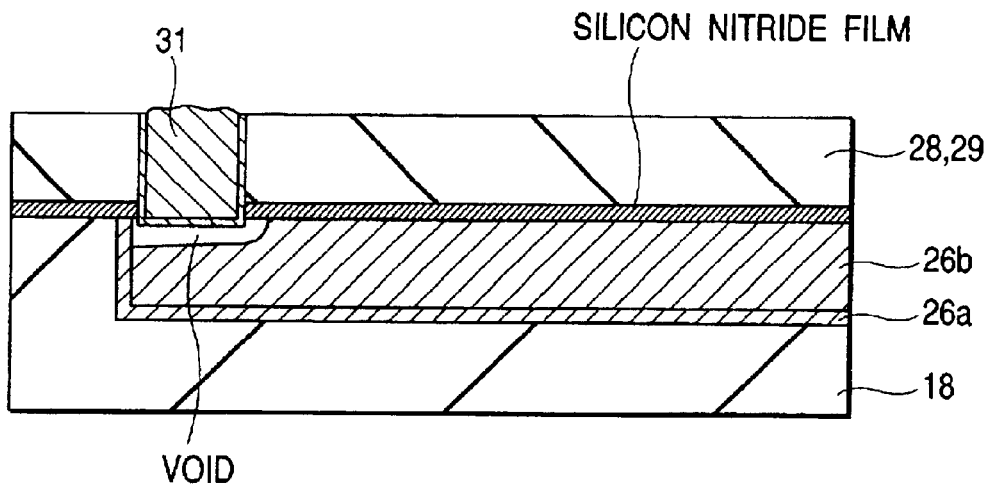
FIGS. 24a and 24b are, respectively, sectional views illustrating the effects of the invention.
Figure 24B:
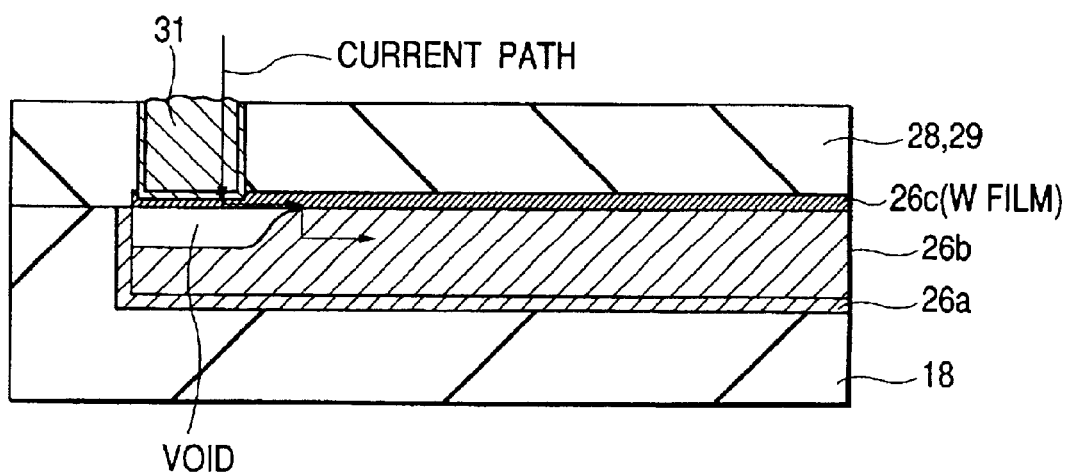

In the case where a void occurs beneath the plug 30, as will be described hereinafter, and covers the contact region therewith, the tungsten film 26c serves as a current path, thereby establishing electric contact, as shown in FIG. 24b. It will be noted that, when the hitherto studied silicon nitride film is formed on the surface of the wiring 26, the contact is impeded by means of a generated void, as is particularly shown in FIG. 24a.

Figure 29:
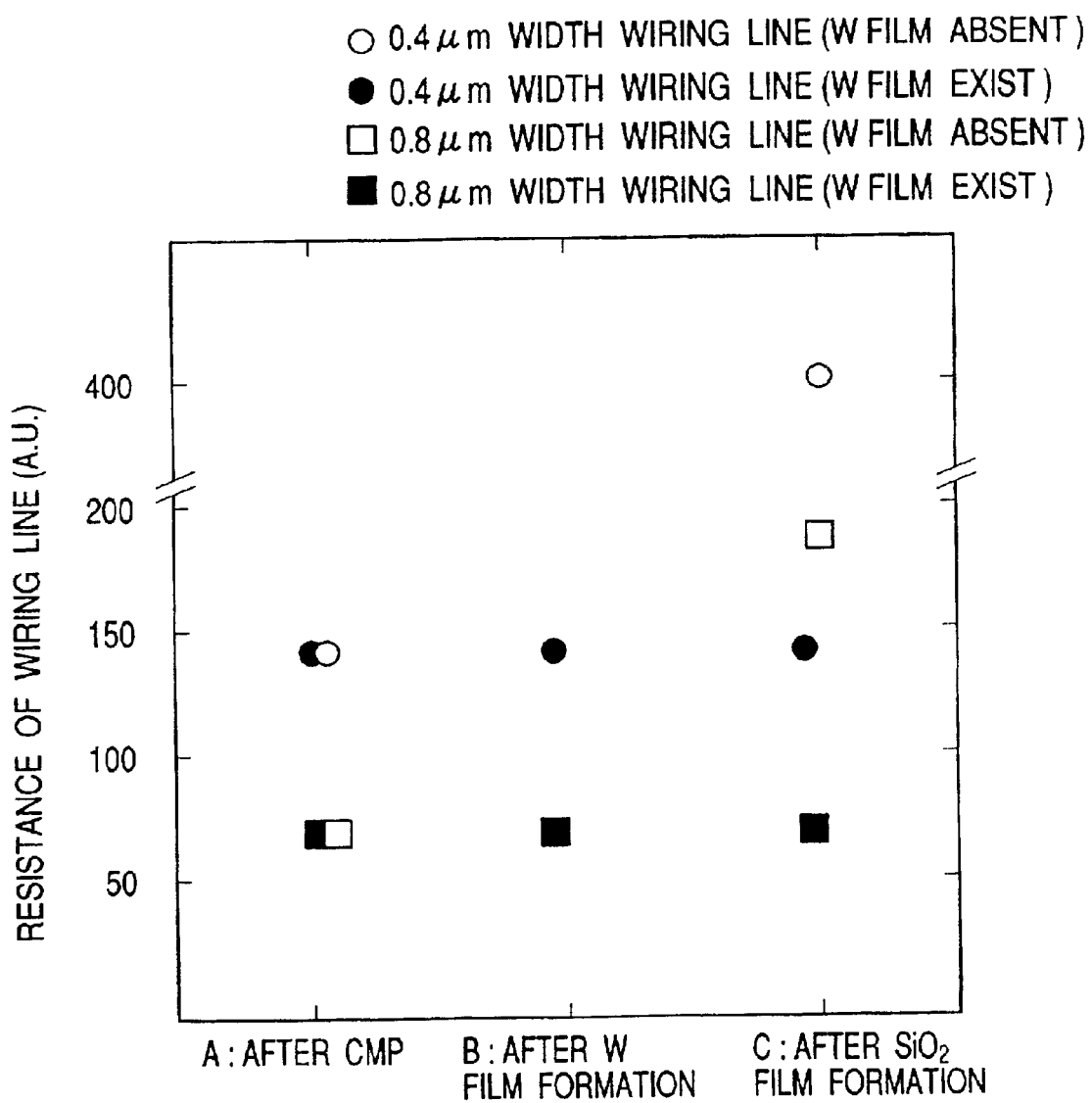
FIG. 29 is a graphical diagram illustrating the effect of the invention.

FIG. 29 is a view showing a resistance of a wiring after CMP of a copper film: A, after formation of a tungsten film: B, and after formation of a silicon oxide: C. In this case, silicon oxide is formed directly on the wiring, and no silicon nitride film is used. The wiring resistance was measured prior to and after the formation of a tungsten film for two wiring widths (i.e. 0.4 μm in width (○, ●) and 0.8 μm in width (□, ■) in cases where the tungsten film was formed (●, ■) and was not formed (○, □). The term "wiring resistance" used herein means the resistance of a wiring patterned with a width of 0.4 μm and a length of 1 mm. As shown in FIG. 29, when the silicon oxide was formed after the formation of the tungsten film in a case where the tungsten film was formed (●, ■), the resistance of the wiring underwent little variation (●: 140 Ω ■: 65 Ω). In contrast, where the silicon oxide film was formed directly on the wiring without formation of a tungsten film, the wiring resistance extremely increased (○: from 140 to 400 Ω □: from 65 to 180 Ω).

It is between that the reason for this is that the wiring (i.e. copper film 26c) was oxidized at the contact between the wiring and the silicon oxide. In this way, the formation of the tungsten film 26c can prevent the surface of the wiring 26 from being oxidized, thereby reducing the rise of the wiring resistance.

Figure 8B:
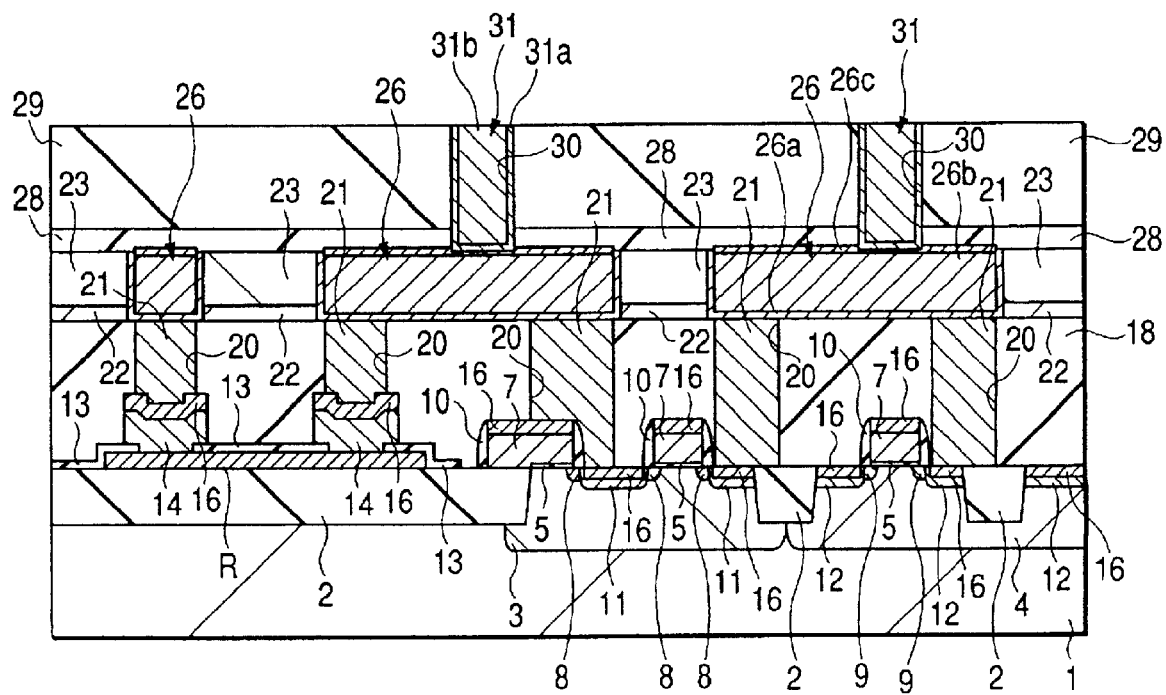

Next, as shown in FIG. 8b, a plug 31 is formed inside the contact hole 30. In order to obtain a good contact characteristic prior to the formation of the plug 31, the contact hole is etched at the bottom thereof.

It will be noted that this etching or the etching for making the contact hole 30 permits the tungsten film 26c at the bottom of the contact hole 30 to be also etched. The tungsten film 26c at the bottom of the contact hole may be lost by these etchings. Alternatively, the tungsten film 26c at the bottom of the contact hole may be separately etched.

The plug 31 is formed in the following manner. Initially, after formation of a titanium nitride film 31a by a CVD method or sputtering method on the silicon oxide 29 including the inside of the contact hole 30, a tungsten film 31b is formed according to a CVD method. Next, the titanium nitride film 31a and the tungsten film 31b, both outside the contact hole 30, are removed by CMP, thereby forming the plug 31. It should be noted that, like the wiring 26, a copper film may be formed on the titanium nitride film 31a by sputtering or plating, thereby providing a copper plug 31. In this case, there may be used, in place of the titanium nitride film 31a, not only a single-layered film, for example, of tantalum, tantalum nitride, tungsten or tungsten nitride and a three-layered laminated film wherein a titanium nitride film is formed on a titanium film, on which a titanium film is further formed (Ti/TiN/Ti), but also a laminated film of Ti/TiN, Ta/TaN/Ta, Ta/TaN or the like.

Figure 9:
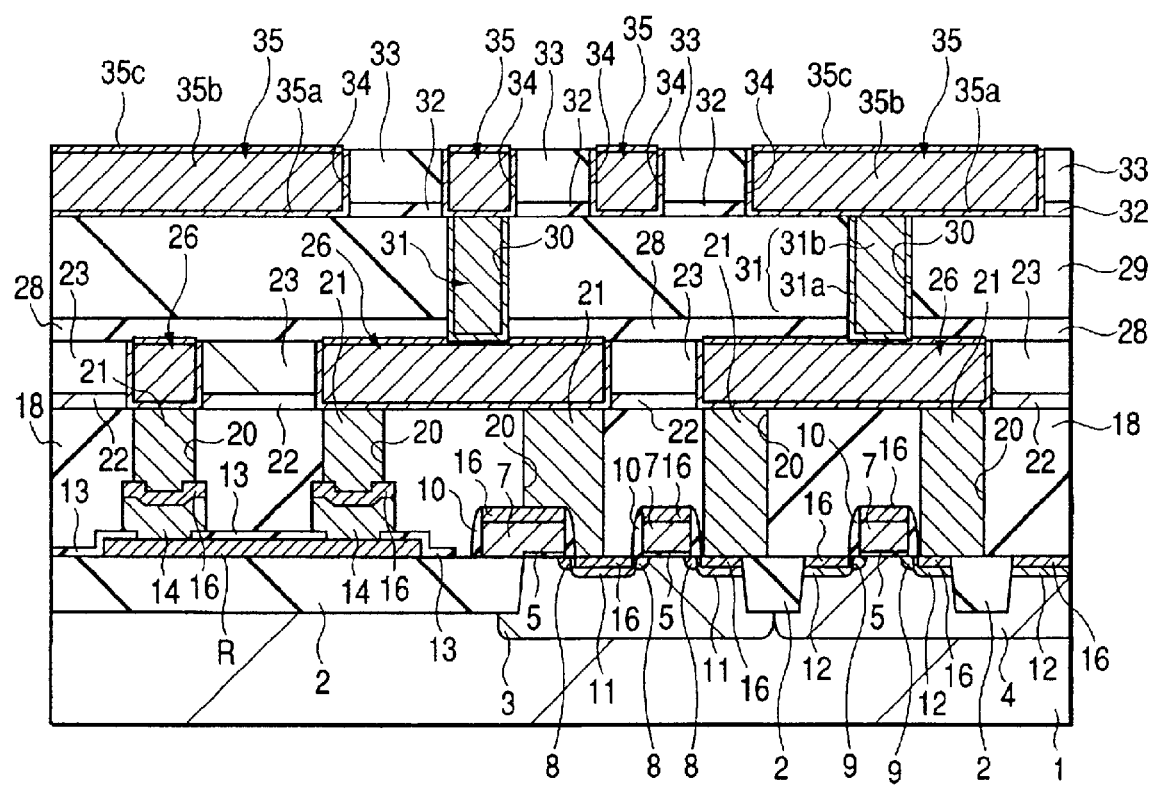
FIG. 9 is a sectional view showing a step in the manufacture of a semiconductor integrated circuit device according Embodiment 1 of the invention.

Subsequently, as shown in FIG. 9, a wiring 35 is formed like the wiring 26. To this end, a silicon nitride film 32 is formed on the silicon oxide 29 and the plug 31, followed by deposition of a silicon oxide film 33 by a CVD method.

Thereafter, like the case of the wiring groove 25, the silicon oxide film 33 is removed by etching from a region where a second wiring is to be formed. The silicon nitride film 32 exposed by the etching is further etched to form a groove 34 for wiring.

A barrier layer 35a made of titanium nitride is deposited on the silicon oxide film 33, including the inside of the wiring groove 34, by a sputtering or CVD method, followed by formation of a copper film 25b on the barrier layer 25a by sputtering. The film-forming conditions are similar to those for the copper film 26b.

Next, the copper film 35b and the barrier layer 35a outside the wiring groove 34 are, respectively, removed by CMP to form a wiring 35.

Tungsten is subjected to selective growth or preferential grown on the wiring 35 (i.e. the copper film 35b) to selectively or preferentially form a tungsten film 35c on the wiring 35. The film-forming conditions are similar to those for the tungsten film 26c formed on the wiring 26.

Figure 10:
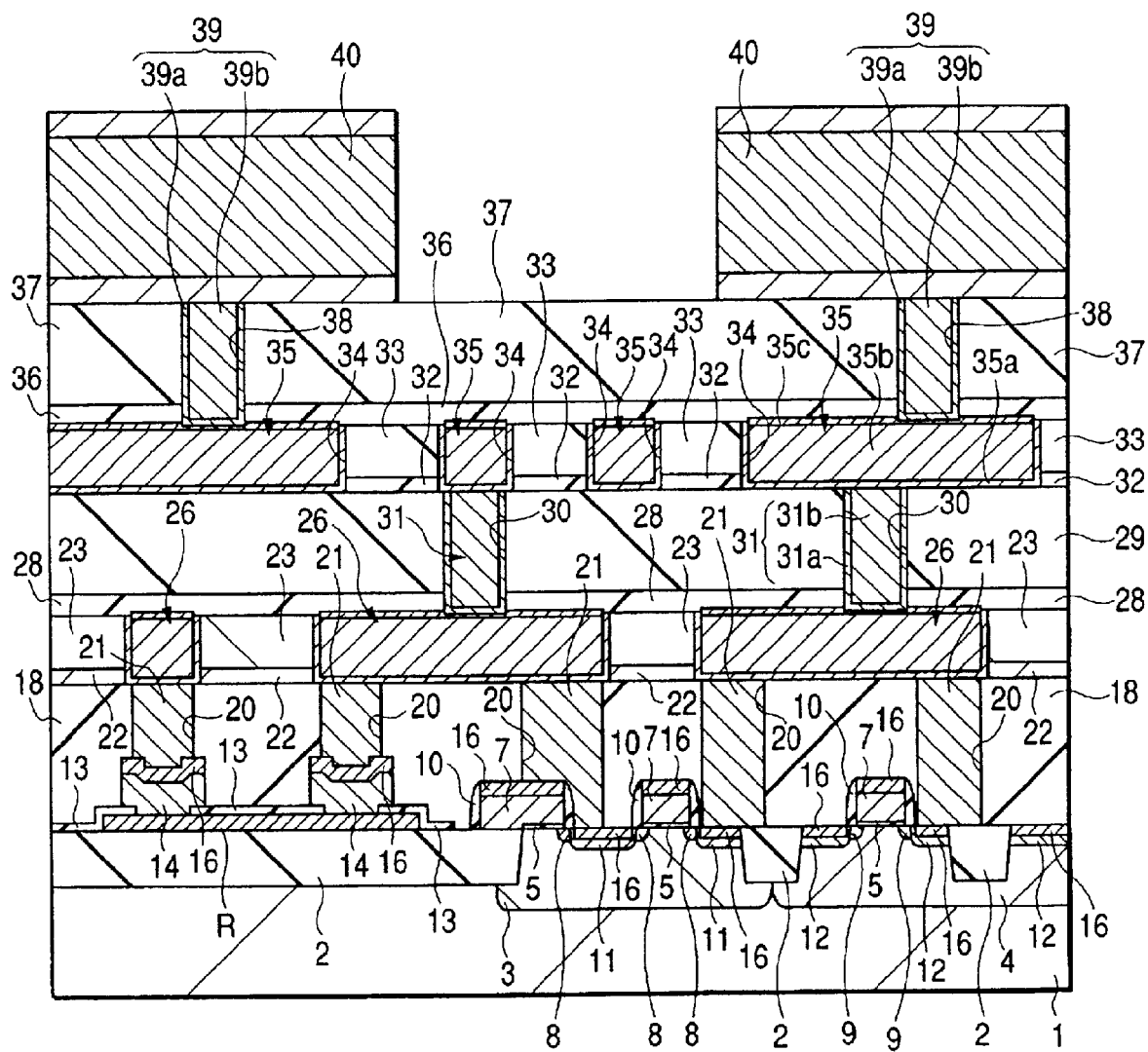
FIG. 10 is a sectional view showing a step in the manufacture of a semiconductor integrated circuit device according Embodiment 1 of the invention.

As shown in FIG. 10, a silicon nitride film 36 is formed on the silicon oxide film 33 and the wiring 35 (i.e. the tungsten film 35c), followed by deposition of a silicon oxide film 37 by a CVD method.

Like the contact hole 30, the silicon oxide film 37 on the contact region of the wiring 35 is removed by etching, and the silicon nitride film 36 exposed by the etching is etched to form a contact hole 38.

Thereafter, like plug 31, a titanium nitride film 39a is formed on the silicon oxide film 37 including the inside of the contact hole 38 by a sputtering or CVD method, followed by formation of a tungsten film 39b by a CVD method. Next, the titanium nitride film 39a and the tungsten film 39b in areas other than the contact hole 38 are removed by CMP to form a plug 39. It will be noted that plug 39 may be made of copper.

Further, a titanium film or titanium nitride film 40a, an aluminum film 40b and a titanium nitride film 40c are successively deposited on the silicon oxide film 37 and the plug 39, followed by patterning of the resultant laminated film in a desired form to form a wiring 40 extending over the plug 39.

Figure 11:
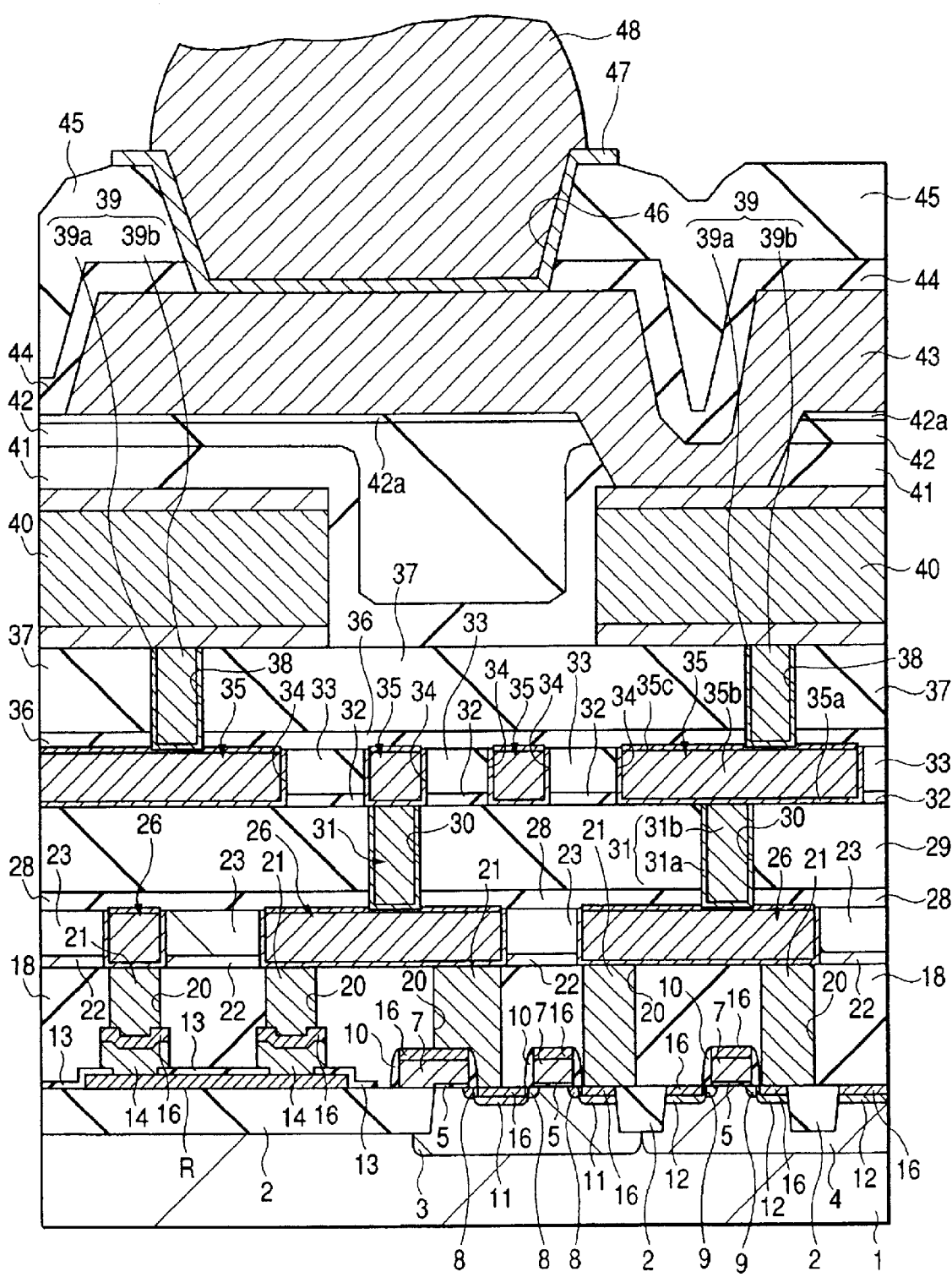
FIG. 11 is a sectional view showing a step in the manufacture of a semiconductor integrated circuit device according Embodiment 1 of the invention.

As shown in FIG. 11, a silicon oxide film 41 is deposited on the wiring 40 and the silicon oxide film 37 by a CVD method, and an SOG film 42 is formed on the silicon oxide film 41. The formation of the SOG film 42 allows the irregularities caused by the wiring 40 to be flattened. It will be noted that a silicon oxide film 42a, such as a TEOS film or the like, may be formed on the SOG film 42 by a CVD method.

The silicon oxide film 42a, SOG film 42 and silicon oxide film 41 are removed by etching from the contact area of the wiring 40. Subsequently, an aluminium film is deposited on the contact area of the wiring 40 and the silicon oxide film 42a by a sputtering method, followed by patterning in a desired form to form a wiring 43.

Thereafter, a silicon nitride film 44 is formed on the wiring 43, and a silicon oxide film 45 is formed on the silicon nitride film 44. The silicon nitride film 44 and silicon oxide film 45 function as a passivation film for preventing penetration of moisture and impurities from outside or suppressing transmission of a rays.

The silicon oxide film 45 and the silicon nitride film 44 are, respectively, removed by etching to permit part of the wiring 43 (i.e. a bonding pad portion) to be exposed. Subsequently, a bump underlying electrode 47, which is made of a laminated film, such as of a gold film, a nickel film and the like, is formed on the exposed wiring 43, followed by formation of a bump electrode 48, made of gold, a solder or the like, on the bump underlying electrode 47.

Thereafter, the resultant device is packaged in a package substrate to complete a semiconductor integrated circuit device, and the illustration for this is omitted herein.

Figure 12:
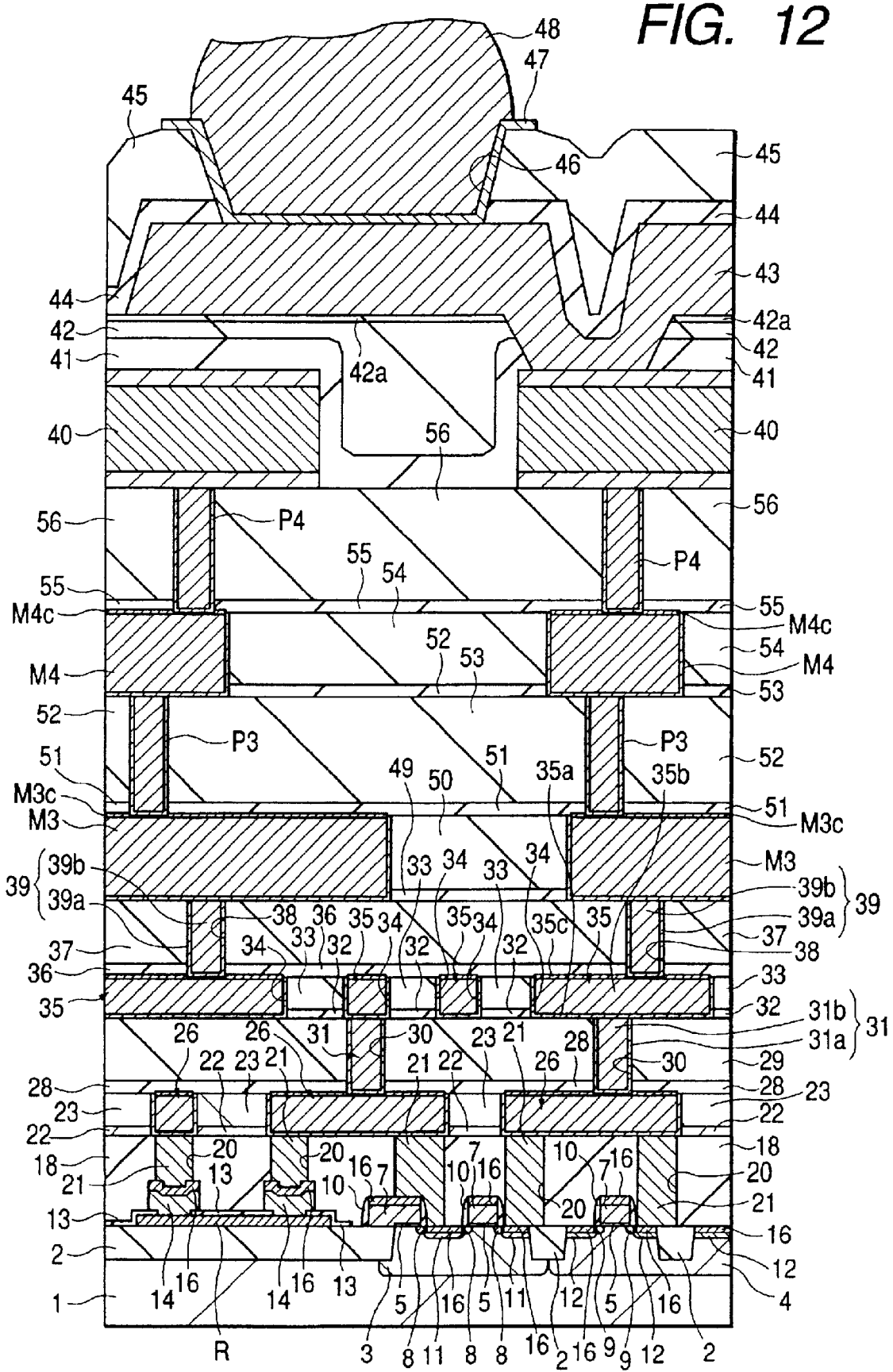
FIG. 12 is a sectional view showing a step in the manufacture of a semiconductor integrated circuit device according Embodiment 1 of the invention.

In the embodiment described hereinabove, the wiring 26 is formed as a first layer wiring and the wiring 35 is formed as a second layer wiring, and the aluminum wiring 40 is formed on the second layer wiring via the plug 39. Alternatively, as shown in FIG. 12, a third layer wiring M3 and a fourth layer wiring M4 may be formed between the second layer wiring 35 and the aluminum wiring 40. In such a case, the third layer wiring M3 and the fourth layer wiring M4 may be, respectively, formed like the first and second layer wirings 26, 35 wherein tungsten films M3c, M4c are, respectively, formed on the wiring surface. A plug P3 between the third layer wiring and the fourth layer wiring and a plug P4 between the fourth layer wiring and the aluminum wiring 4 may be, respectively, formed in the same manner as the plugs 31, 39. Reference numerals 49, 51, 52 and 55, respectively, indicate a silicon nitride film, and reference numerals 50, 53, 54 and 56, respectively, indicate a silicon oxide film.

In this embodiment, the tungsten films 26c, 35c are selectively or preferentially grown on the wirings 26, 35, respectively, and the tungsten films may be selectively or preferentially grown in the plugs 31, 39, respectively.

Embodiment 2

In Embodiment 1, the wirings are formed according to a so-called single damacene method wherein the wiring is formed at a step different from the step of forming a plug connecting the wirings therewith, but the wirings also may be formed according to a dual damacene method. FIGS. 13 to 20 are, respectively, sectional views showing, one by one, the steps of a method of manufacture of a semiconductor integrated circuit device according to Embodiment 2 of the invention. The steps up to the formation of the plug 21 illustrated with reference to FIG. 1a to FIG. 6a are similar to those of Embodiment 1 and will not be repeatedly described herein.

The semiconductor substrate 1 shown in FIG. 6a has formed thereon the n-channel MISFET Qn and the p-channel MISFET Qp, which are, respectively, provided with a source and drain having a LDD (lightly doped drain) structure on the p-type well 3 and the n-type well 4, and also is provided with a resistor element including, on the wide element isolation region 2, the conductor R, the insulating film 13 covering the conductor film R therewith and the lead electrode 14 on the insulating film 13. Moreover, the interlayer insulating film 18 is formed over the semiconductor elements, and the plug 21 that reaches the source-drain regions of the MISFET's and the resistor element is formed in the interlayer insulating film 18.

Such a semiconductor substrate 1 as mentioned above is provided; and, as shown in FIG. 13a, a silicon nitride film 22 is formed over the interlayer insulating film 18 and the plug 21, followed by deposition of a silicon oxide film 23 by a CVD method.

Figure 13A:
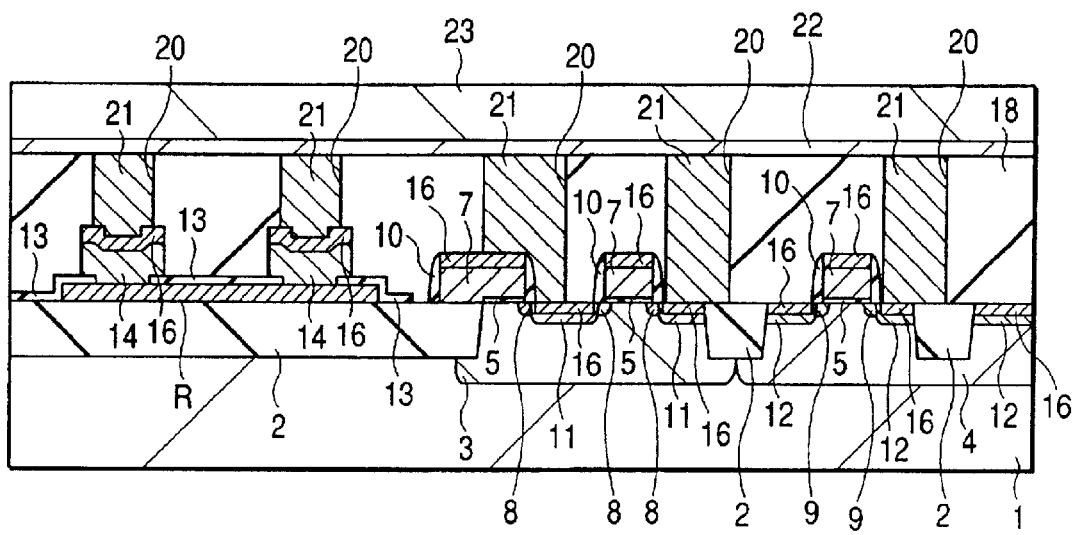
FIGS. 13a and 13b are, respectively sectional views showing steps in the manufacture of a semiconductor integrated circuit device according to Embodiment 2 of the invention.
Figure 13B:
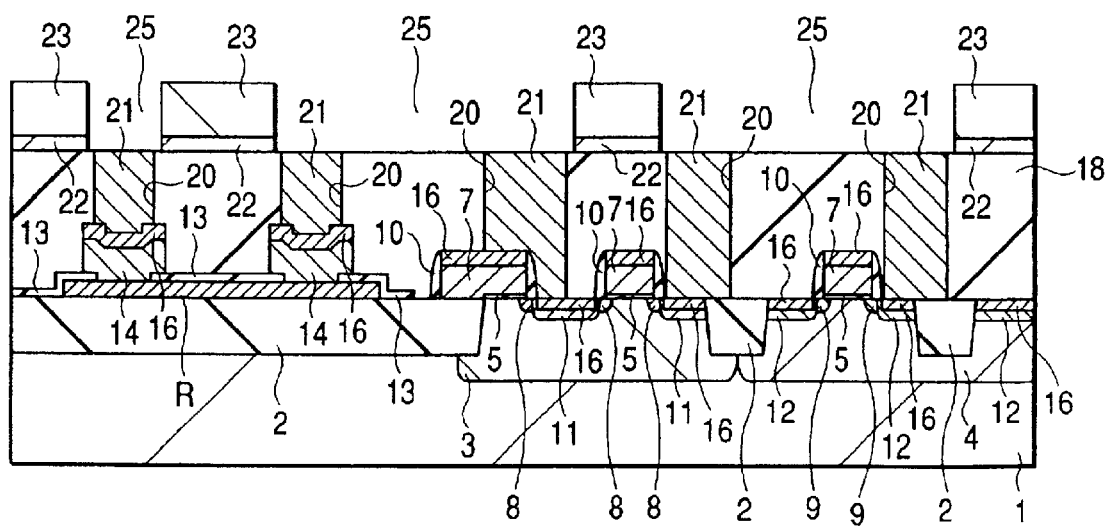

Next, as shown in FIG. 13b, the silicon oxide film is removed by etching from a region where a first layer wiring is to be formed, and the silicon nitride layer 22 exposed by the etching is further etched to form a groove 25 for wiring. Accordingly, the etching of the silicon oxide layer 23 is performed under conditions where the silicon nitride film 22 is unlikely to be etched and the silicon oxide film 23 is likely to be etched. Thereafter, etching is carried out under conditions where the silicon nitride film 22 is likely to be etched. In this way, the silicon nitride film 22 is used as an etching stopper. In a case where the degree of etching can be controlled, such as by time, the silicon oxide film 23 may be formed directly on the silicon oxide film 18 without formation of the silicon nitride film 22.

Figure 14A:
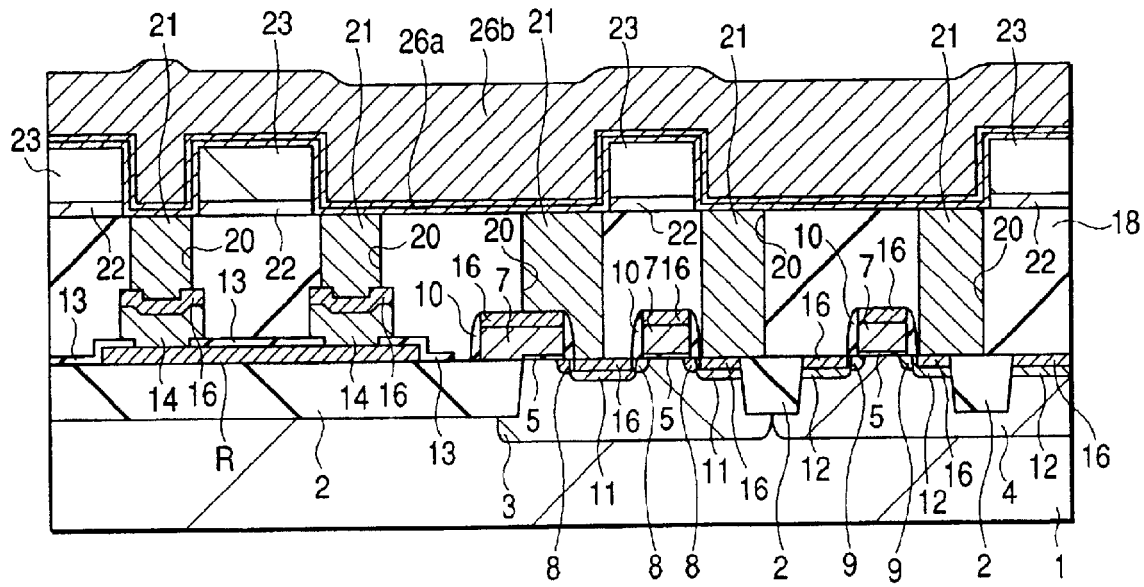
FIGS. 14a and 14b are, respectively sectional views showing steps in the manufacture of a semiconductor integrated circuit device according to Embodiment 2 of the invention.

Subsequently, as shown in FIG. 14a, a barrier layer 26a made of titanium nitride is deposited on the silicon oxide film 22 including the groove 25 for wiring by a sputtering or CVD method. A copper film 26b is formed on the barrier layer 26a by a sputtering method. More particularly, a 0.4 $\mu$m thick copper film 26b is formed at a flat portion under conditions, which include a distance between a target and a wafer of 300 mm, a film-forming pressure of 0.2 mTorr ($0.2 \times 1.33322 \times 10^{-1}$ Pa) or below, a film-forming initial temperature of 20° C., and a final arrival temperature of 300° C., followed by annealing in a reductive atmosphere, or by treating in an atmosphere of hydrogen under conditions, for example, of 15 Torr ($15 \times 1.33322 \times 10^2$ Pa) and 430° C. for two minutes. This hydrogen treatment is effected so as to reduce the oxide layer on the surface of the copper film and fluidize the copper film, thereby improving the burying characteristic of the copper in the wiring groove. The treatment with hydrogen leads to an improved quality of the copper film, and thus, the Cu wiring 26 can be improved in reliability.

It will be noted that the copper film 26b may be formed by an electroplating method. In this case, after formation of a thin copper film by a sputtering method, a metallic deposit may be grown while using a thin film, such as a seed film. More particularly, a 200 nm thick copper film is formed at a flat portion under conditions, which include a distance between a target and a wafer of 300 mm, a film-forming pressure of 0.2 mTorr ($0.2 \times 1.33322 \times 10^{-1}$ Pa) or below, a film-forming initial temperature of 10° C., and a final arrival temperature of 50° C. Thereafter, the semiconductor substrate 1 is immersed in a plating solution based on sulfuric acid and copper sulfate. The semiconductor substrate 1 has a negative potential applied thereto for electroplating until a 600 nm thick copper film is formed at a flat portion. FIG. 14a shows the state of the copper film 26b formed by this electroplating method. The seed film may be formed by a CVD method. This copper film 26b is treated with hydrogen in the same manner as set out above. The hydrogen treatment leads to an improved quality of the copper film 26b, thereby improving the reliability of the Cu wiring.

The barrier layer 26a may be made not only of titanium nitride, but also a single-layered film, such as film of tantalum, tantalum nitride, tungsten or tungsten nitride. Alternatively, there may be used, aside from a three-layered laminated film obtained by forming a titanium nitride film formed on a titanium film and further forming a titanium film (Ti/TiN/Ti), laminated films of Ti/TiN, Ta/TaN/Ta, Ta/TaN and the like.

Figure 14B:
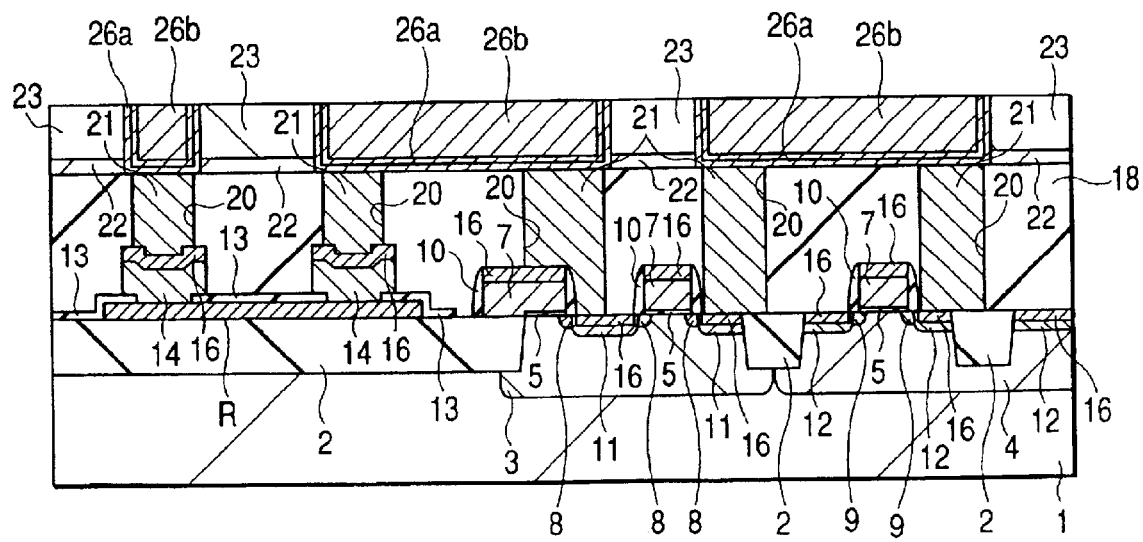

Next, as shown in FIG. 14b, the copper film 26b and the barrier layer 26a are, respectively, removed from the outside of the groove 25 for wiring by CMP to form a wiring 26.

Thereafter, tungsten is selectively or preferentially grown on the wiring 26 (i.e. the copper film 26b) to form an approximately 2 to 20 nm thick tungsten film 26c on the wiring 26 (i.e. the copper film 26b). The tungsten film 26c is formed under conditions, for example, of 0.3 Torr ($0.3 \times 1.33322 \times 10^2$ Pa), a preset temperature of 460° C., a flow rate of tungsten hexafluoride ($WF_6$) of 5 sec., and a flow rate of hydrogen ($H_2$) of 500 scc., for 1.5 minutes.

By the treatment, tungsten is selectively grown only on the wiring 26, or tungsten is preferentially grown on the wiring 26 in comparison with the silicon oxide film 18.

It will be noted that aside from tungsten, there may be used, as the cap conductive film on the wiring 26, a TiN, Ta, TaN, WN or Ni film. The resistance of tungsten ranges from 5 to 20 $\mu\Omega\cdot$cm, which is smaller than a resistance of TiN of 80 to 150 $\mu\Omega\cdot$cm, so that the use of tungsten film ensures good contact at a low resistance.

Thus, according to this embodiment, since tungsten is formed on the wiring 26 by selective growth or preferential growth, the wiring 26 is not directly in contact on the upper surface thereof with the insulating films, such as the silicon nitride film and the silicon oxide film, but is in contact with the tungsten film 26c that is made of the same metal as the wiring, thereby permitting electromigration to be reduced. As stated hereinbefore, this is assumed for the reason that when comparing the interface between the copper and the barrier film with the interface between the copper and the silicon nitride film, the activation energy of diffusion is greater for the interface between the copper and the barrier film (i.e. copper is more unlikely to be diffused). Thus, the wiring life can be improved.

The wiring 26 is covered at the side faces and bottom face thereof with the barrier layer 26a and at the upper face thereof with the tungsten film 26c. Thus, the wiring is covered wholly with hard metals, and thus, the breakage of the wiring or the like ascribed to stress migration can be prevented. As a result, the wiring life can be improved.

Even if a burying failure occurs in a case where the copper film 26b is buried in the wiring groove 25, or if breakage, shrinkage or scratches are caused in the surface of the wiring 26 by CMP or a subsequent thermal treatment at the time of the formation of the wiring 26 (FIG. 22a), the formation of the tungsten film 26c on the surface of the wiring covers the defective portions, such as a breakage, thereby permitting the defects to be repaired (FIG. 22b).

As stated hereinabove, the growth of an approximately 2 to 20 nm thick tungsten film is possible at a relatively low pressure (1 Torr (1×1.33322×10² Pa) or below), and thus, the coverage on the surface of the wiring 26 is good, enabling small defects to be repaired.

These defects cause voids to occur, and electromigration is induced from such a void as a starting point, so that the repairing of the defect results in the reduction of electromigration. Thus, the wiring life can be improved.

Figure 15A:
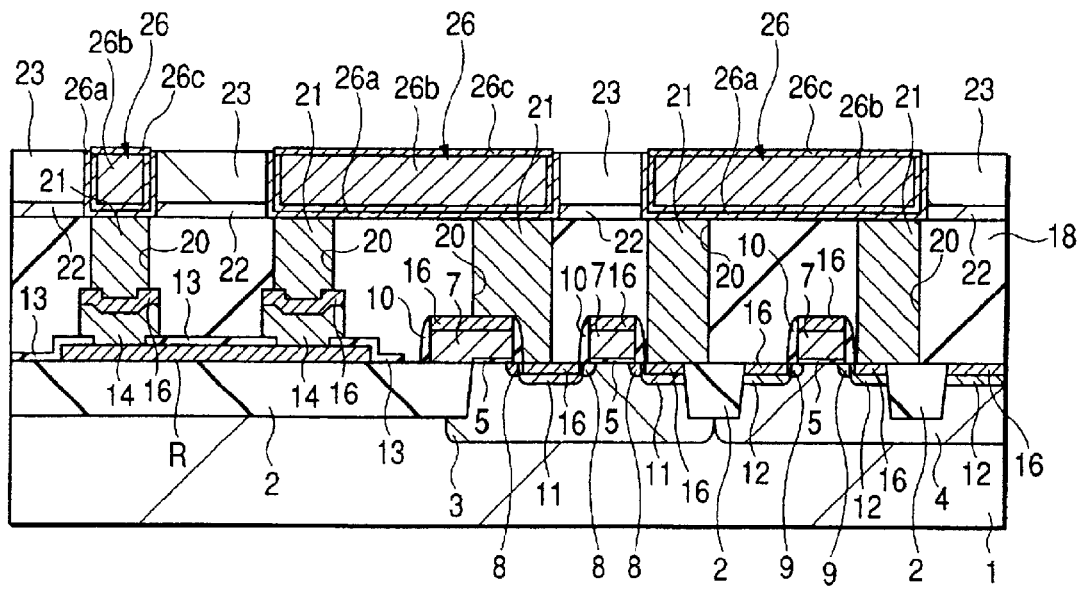
FIGS. 15a and 15b are, respectively sectional views showing steps in the manufacture of a semiconductor integrated circuit device according to Embodiment 2 of the invention.
Figure 15B:
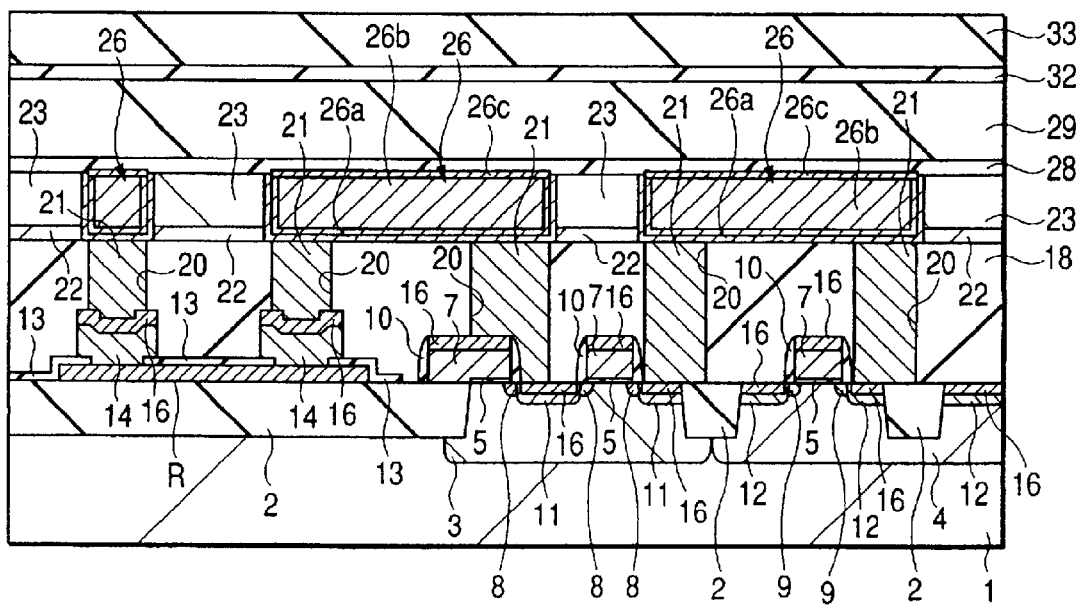

Next, as shown in FIG. 15b, a silicon nitride film 28, a silicon oxide film 29, a silicon nitride film 32 and a silicon oxide film 33 are successively formed on the silicon oxide film 23 and the wiring 26 by a CVD method. The silicon nitride film 32 serves as an etching stopper when the wiring groove 34 is formed, and the silicon nitride film 28 functions as an etching stopper when a contact hole 30 for connection with the lower wiring 26 is formed.

Figure 16A:
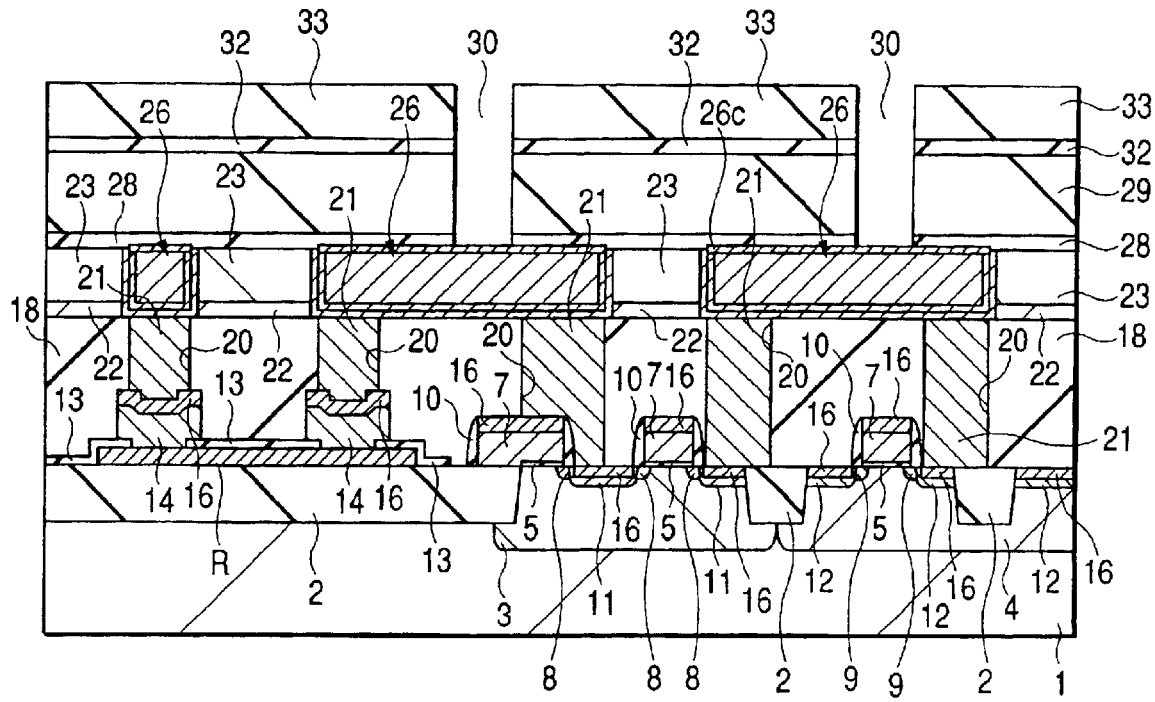
FIGS. 16a and 16b are, respectively sectional views showing steps in the manufacture of a semiconductor integrated circuit device according to Embodiment 2 of the invention.

Next, as shown in FIG. 16a, the silicon oxide film 33, silicon nitride film 32 and silicon oxide film 29 are, respectively, removed by etching from the contact region of the wiring 26, and the silicon nitride film 28 exposed by the etching is etched to form contact holes 30.

Figure 16B:
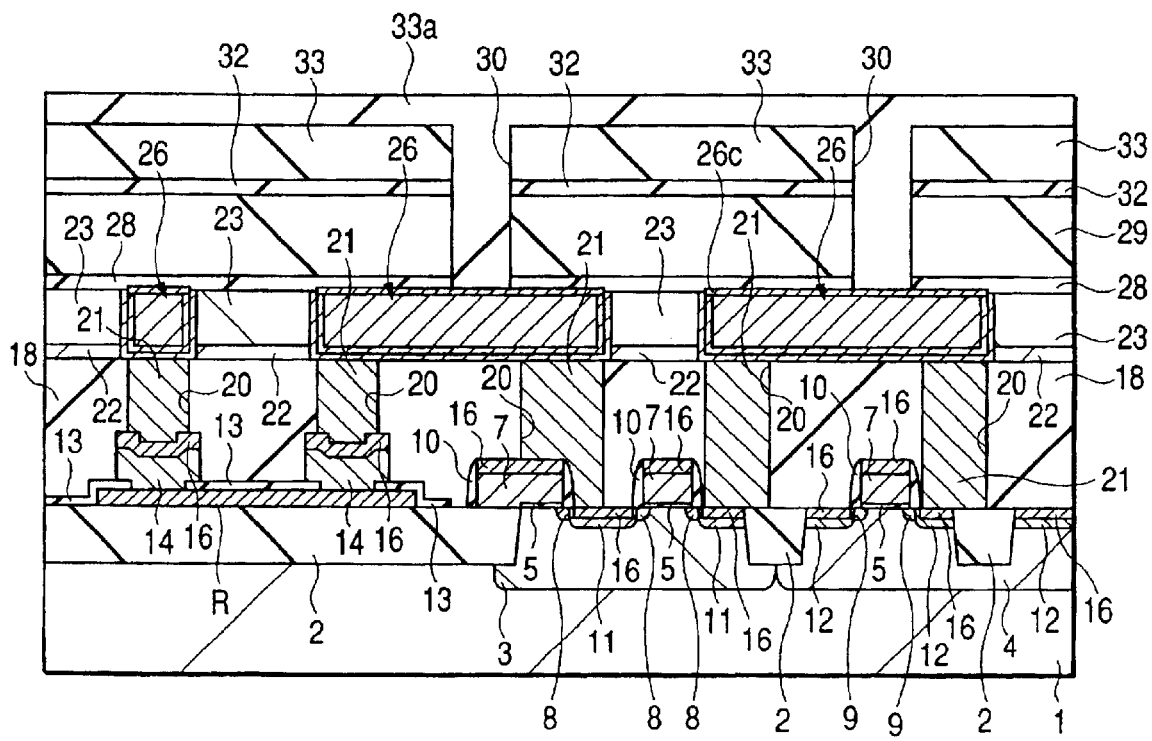
Figure 17A:
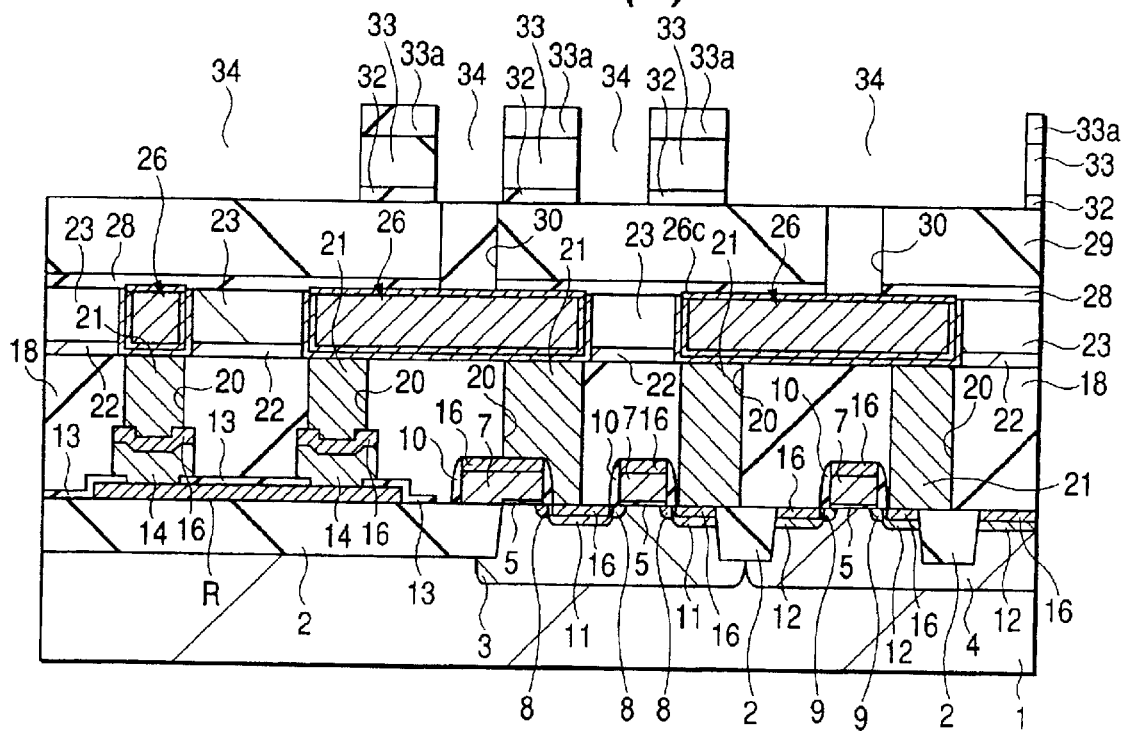
FIGS. 17a and 17b are, respectively sectional views showing steps in the manufacture of a semiconductor integrated circuit device according to Embodiment 2 of the invention.

Thereafter, as shown in FIG. 16b, an anti-reflecting film or resist film 33a is formed on the silicon oxide film 33 including the inside of the contact holes 30 to bury the contact holes with the anti-reflecting film or resist film 33a. Further, as shown in FIG. 17a, the anti-reflecting film or resist film 33a and the silicon oxide film 33 are etched through the mask of a photoresist film (not shown) having an opening for a region where a second layer wiring is to be formed. Subsequently, the silicon nitride-film 32 exposed by the etching is etched to form a groove 34 for wiring. At that time, the anti-reflecting film or resist film 33a remains in the contact hole. Thereafter, the anti-reflecting film or resist film 33a left in the contact hole and the photoresist film are removed.

Figure 17B:
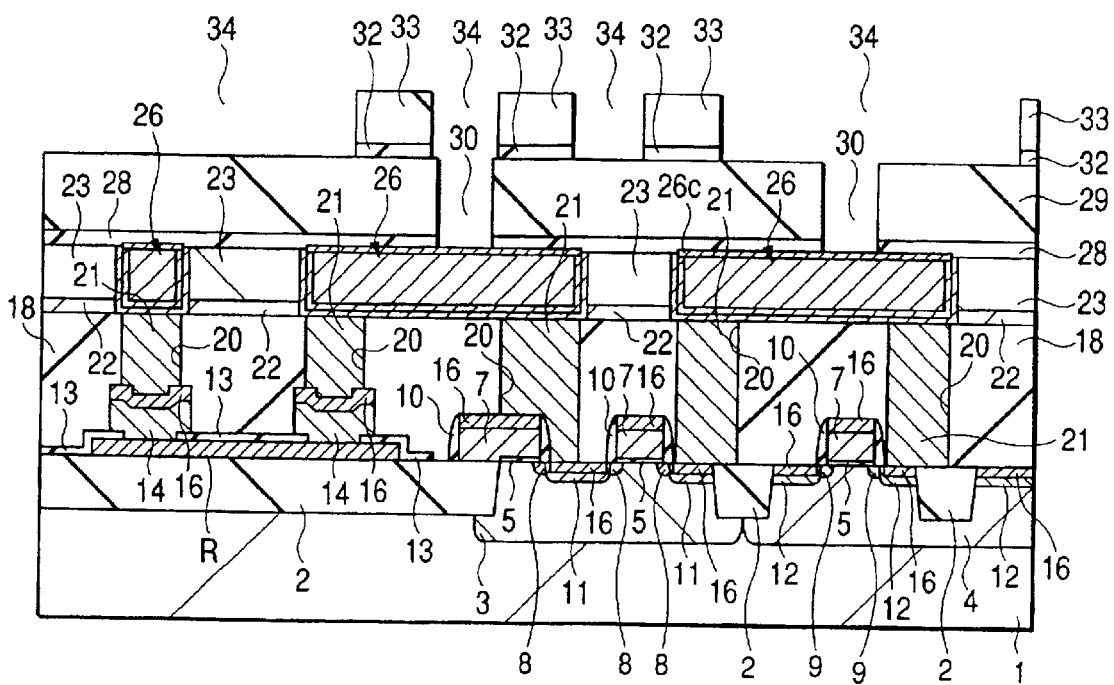

According to the steps set forth above, the wiring groove 34 for second layer wiring and the contact hole 30 connecting a second layer wiring and the first layer wiring therewith are formed as shown in FIG. 17b.

The contact hole 30 may be formed by etching the silicon oxide film 33 and the silicon nitride film 32 through the mask of the photoresist film having an opening for a region where a second layer wiring is to be formed, thereby forming a groove 34 for wiring, burying the wiring groove 34 with an anti-reflecting film or the like, and etching the anti-reflecting film, silicon oxide film 29 and silicon nitride film 28 through a mask of a photoresist film having an opening for the contact region on the first layer wiring.

The silicon nitride films 32, 28 used as an etching stopper need not be used when the degree of etching can be controlled, such as by time. More particularly, a silicon oxide film having a total thickness of the silicon oxide films 29 and 33 formed on the silicon oxide 23 and the wiring 26 is formed. The silicon oxide is etched for a given time through a mask of a resist film having an opening for a region where a second layer wiring is to be formed, thereby forming a groove 34 for wiring, followed by formation of the contact hole 30 through a mask of a resist film having an opening for the contact area on the first layer wiring. In this case, after the formation of the contact hole 30, the wiring groove 34 may be formed.

After the formation of the silicon oxide film 29 (called B film species) on the tungsten film 26c and the silicon oxide film (called A film species), the silicon oxide film 33 is further formed thereon with use of an A film species or C film species different from those of the silicon oxide films 29, 23. For the etching of the silicon oxide 33 (A or C film species), etching is effected under conditions where the lower silicon oxide film 29 (B film species) is unlikely to be etched and the silicon oxide film 33 (A or C film species) is likely to be etched. For the etching of the silicon oxide film 29 (B film species), etching is effected under conditions where the lower tungsten film 26c is unlikely to be etched and the silicon oxide film 29 (B film species) is likely to be etched.

These film species A, B and C are not limited to a silicon oxide film, but may be applied to so long as insulating films are concerned. Examples of these films include not only CVD silicon oxide films, organic or inorganic coating films and PIQ films, but also SiOF films, porous silica and organic insulating films.

Subsequently, in order to obtain a good contact characteristic, the contact hole 30 is etched at the bottom thereof.

Figure 18A:
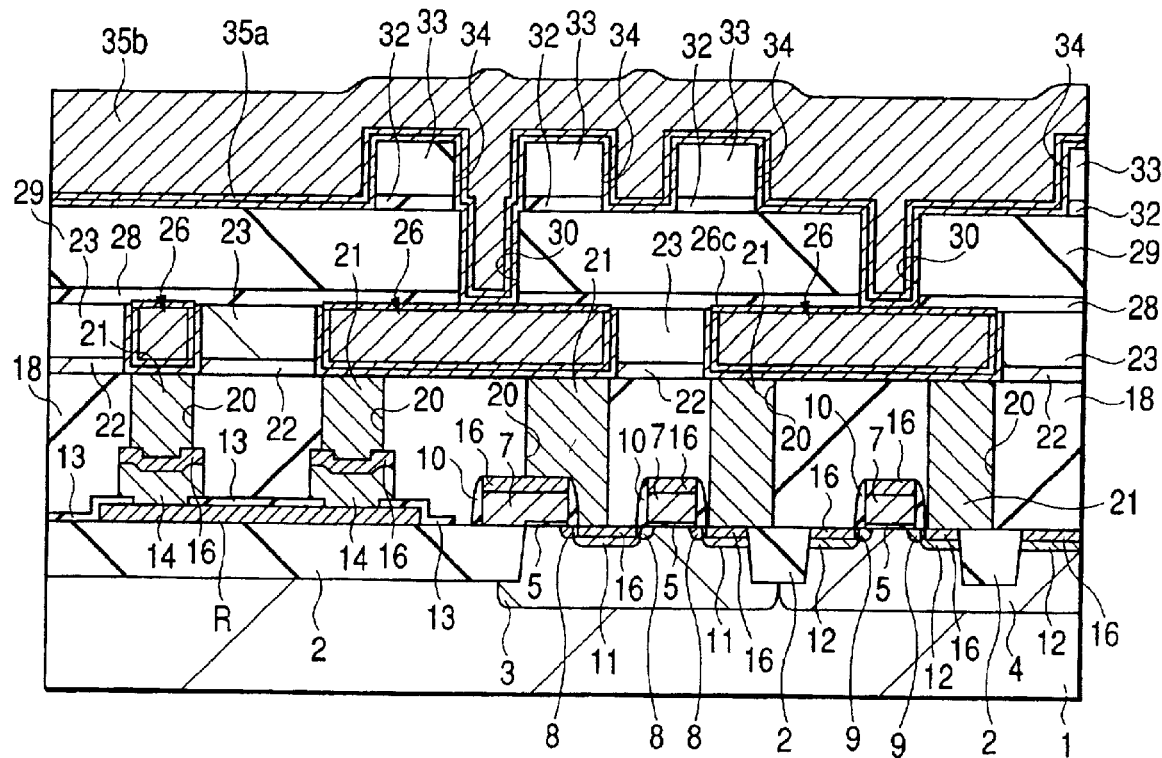
FIGS. 18a and 18b are, respectively sectional view showing steps in the manufacture of a semiconductor integrated circuit device according to Embodiment 2 of the invention.

As shown in FIG. 18a, a barrier layer 35a made of titanium nitride is deposited on the silicon oxide film 32 including the wiring groove 34 and the inside of the contact hole 30 by a sputtering or CVD method. Thereafter, a copper film 35b (i.e. a conductive film) is formed on the barrier layer 35a by electroplating, like the copper film 26b. The copper film 35b may be formed by a sputtering method. The barrier layer may be formed not only of titanium nitride, but also of a single-layered film, such as a film of tantalum or a laminated film such as of Ti/TiN/Ti or the like, as described with reference to Embodiment 1.

Figure 18B:
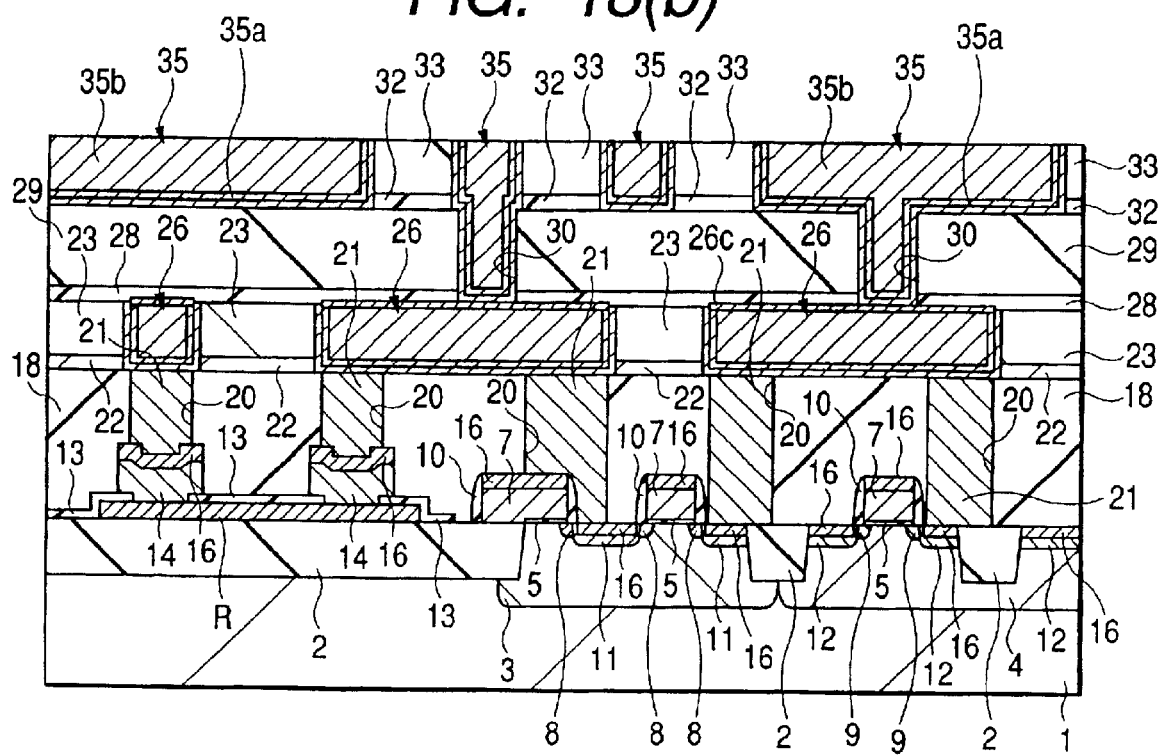

Next, as shown in FIG. 18b, the copper film 35b and the barrier layer 35a are removed from the outside of the wiring groove 34 and the contact hole 30 by CMP to form a wiring 35 and a connection between the wiring 35 and the wiring 26.

In this way, when the copper film 35b is buried simultaneously in the wiring groove 35 and the contact hole 30 according to the dual damascene method, the connection between the second layer wiring and the first layer wiring is realized by copper film 35b-titanium nitride 35a-tungsten 35c-copper film 26b, thereby obtaining a better contact characteristic than in Embodiment 1.

Figure 19:
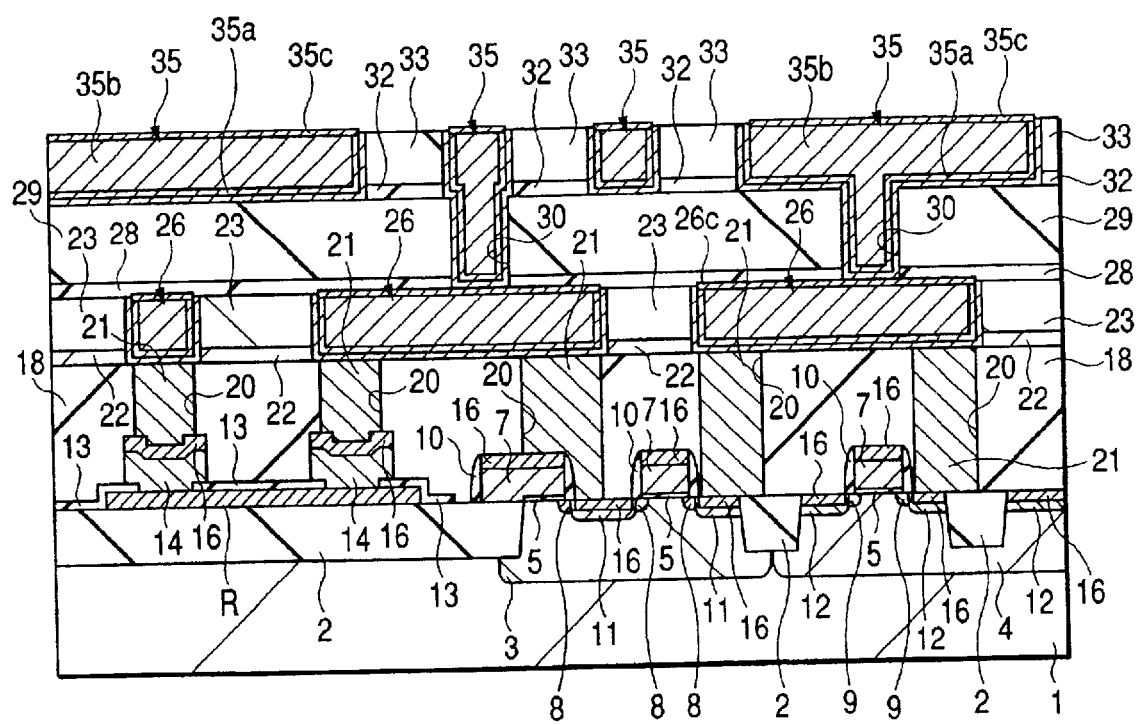
FIG. 19 is a sectional view showing a step in the manufacture of a semiconductor integrated circuit device according to Embodiment 2 of the invention.

As shown in FIG. 19, tungsten is selective or preferentially grown on the wiring 35 (copper film 35b) to form an approximately 2 to 20 nm thick tungsten film 35c (i.e. a cap conductive film). The tungsten film 35c is formed, for example, under conditions of 0.3 Torr ($0.3 \times 1.33322 \times 10^2$ Pa), a preset temperature of 460° C., a flow rate of $WF_6$ of 5 sec., and a flow rate of $H_2$ of 500 sec., for 1.5 minutes.

According to such a treatment as mentioned above, tungsten is selectively or preferentially grown only on the wiring 35 (copper film 35b), or tungsten is preferentially grown on the wiring 35 rather than the silicon oxide film 34.

Copper is prevented from scattering when the contact hole 30 is formed or the contact hole 30 is etched at the bottom thereof, or at the time of sputtering etching. This is like the case of Embodiment 1, as described with reference to FIG. 23(a) and FIG. 23(b).

The use of the selective growth or preferential growth allows easy formation of the tungsten film on the surface of the wiring 35. Thus, a relatively uniform tungsten film can be formed on the surface of the wiring, as illustrated in Embodiment 1. When using selective growth or preferential growth, the tungsten film on the wiring surface can be formed thinly, leading to the advantages that a good contact characteristic is obtained, that the silicon nitride film on the surface of the copper film, which has a high dielectric constant and impedes the high-speed operation, can be replaced by the tungsten film, thus realizing a device capable of high-speed operation, and that, in a case where a void occurs in the vicinity of a plug described hereinafter that covers the contact region, the tungsten film serves as a current path, ensuring the required contact (see FIGS. 24(a) and 24(b)). These advantages are just as described with reference to Embodiment 1.

Further, as described in Embodiment 1 while referring to FIG. 29, the formation of the tungsten film 35c can prevent the surface of wiring 35 from being oxidized, reducing the rise in the wiring resistance.

It may occur that TiN, Ta, TaN, WN or Ni is formed on the copper wiring, aside from tungsten. The resistance of tungsten is at 5 to 20 $\mu\Omega\cdot cm$, which is smaller than TiN, whose resistance is at 80 to 150 $\mu\Omega\cdot cm$, so that the use of a tungsten film contributes to good contact.

Figure 20:
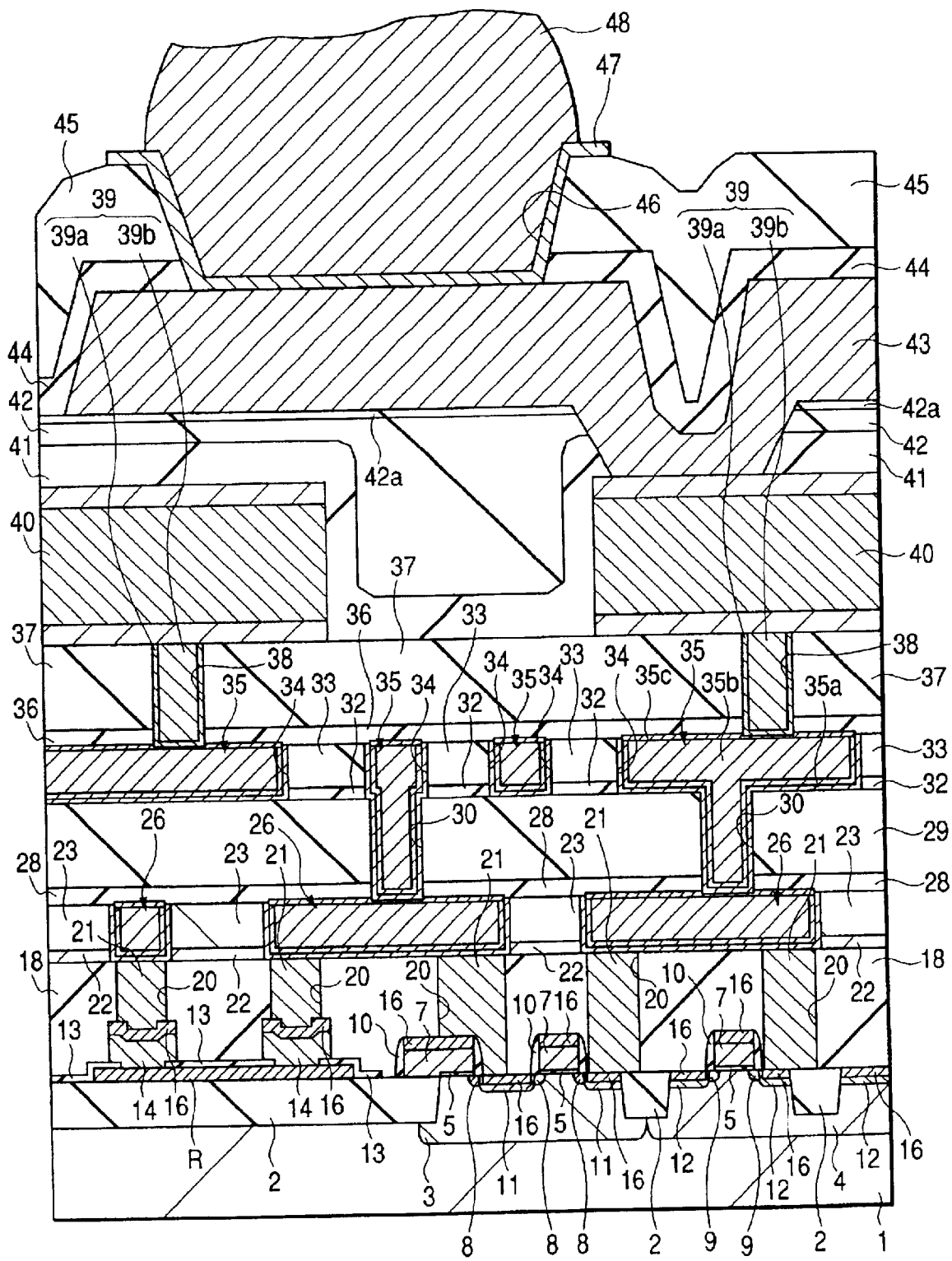
FIG. 20 is a sectional view showing a step in the manufacture of a semiconductor integrated circuit device according to Embodiment 2 of the invention.

Next, as shown in FIG. 20, a silicon nitride film 36 and a silicon oxide film 37 are successively formed on the silicon oxide film 33 and the wiring 35 by a CVD method, respectively. Thereafter, a plug 39 is formed to further form a wiring 40. These formation steps are similar to those of Embodiment 1 and will not be described in more detail. Moreover, a wiring 43 formed on the wiring 40 via a silicon oxide film 41, and a bump underlying electrode 47 and a bump electrode 48 formed on the wiring 43 via a silicon nitride film 44 and a silicon oxide film 45 are, respectively, formed in the same manner as in Embodiment 1, for which a detailed description will not be repeated.

After the formation of the bump electrode 48, the resultant device is packaged in a package substrate or the like to complete a semiconductor integrated circuit device.

Figure 21:
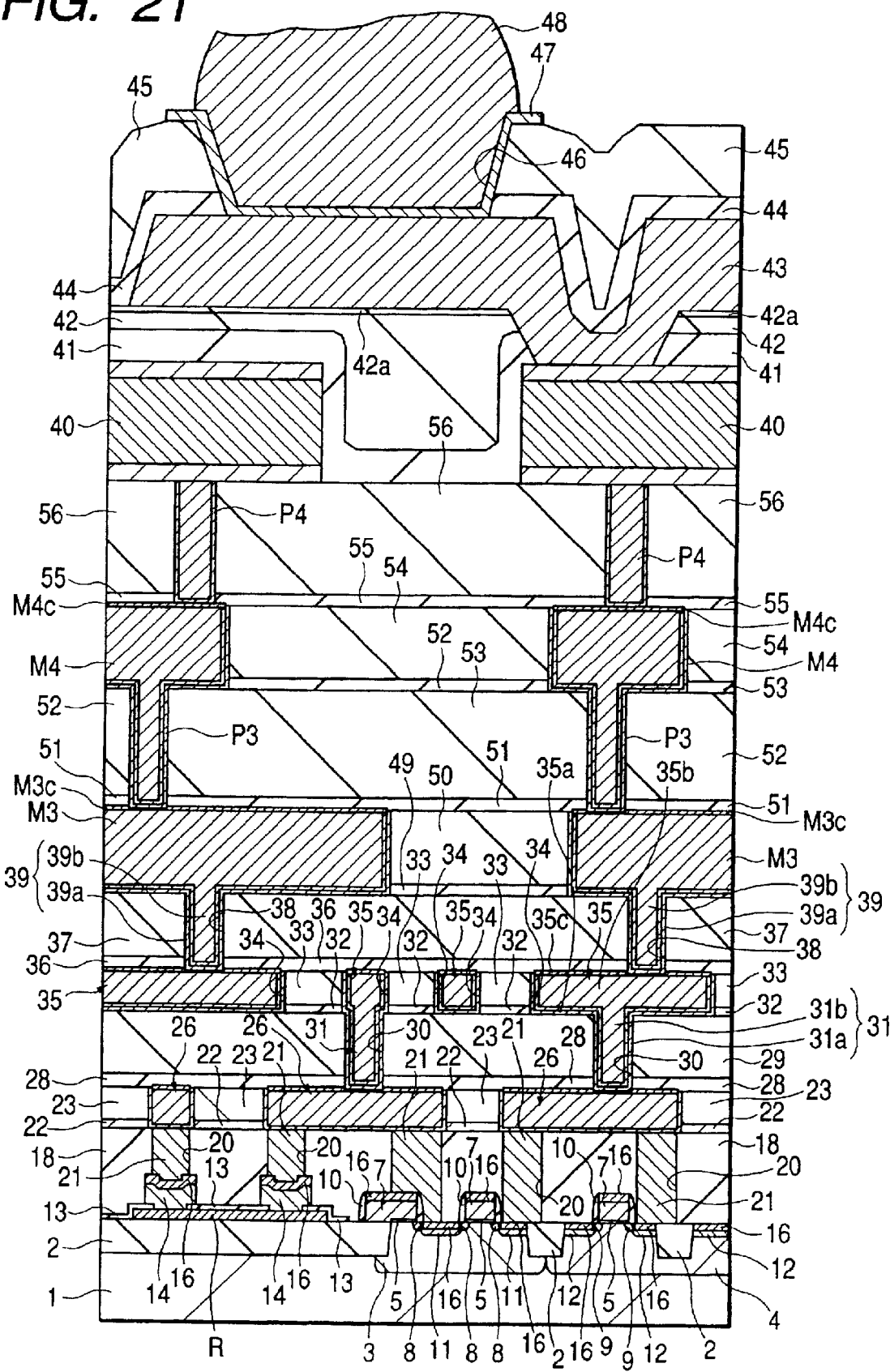
FIG. 21 is a sectional view showing a step in the manufacture of a semiconductor integrated circuit device according to Embodiment 2 of the invention.

In this embodiment, although the first layer wiring 26 and the second layer wiring 35 are formed, and the aluminum wiring 40 is formed on the second layer wiring 35 through the plug 39, a third layer wiring M3 and a fourth layer wiring M4 may be formed between the second layer wiring and the aluminum wiring 40 (FIG. 21), like Embodiment 1. In such a case, the third layer wiring and the fourth layer wiring are formed according to the dual damacene method, like the first and second layer wirings. More particularly, after the formation of a wiring groove and a contact hole, they are simultaneously buried to form the wirings. The wirings are formed on the surfaces thereof with tungsten films (M3c, M4c).

Embodiment 3

Figure 25A:
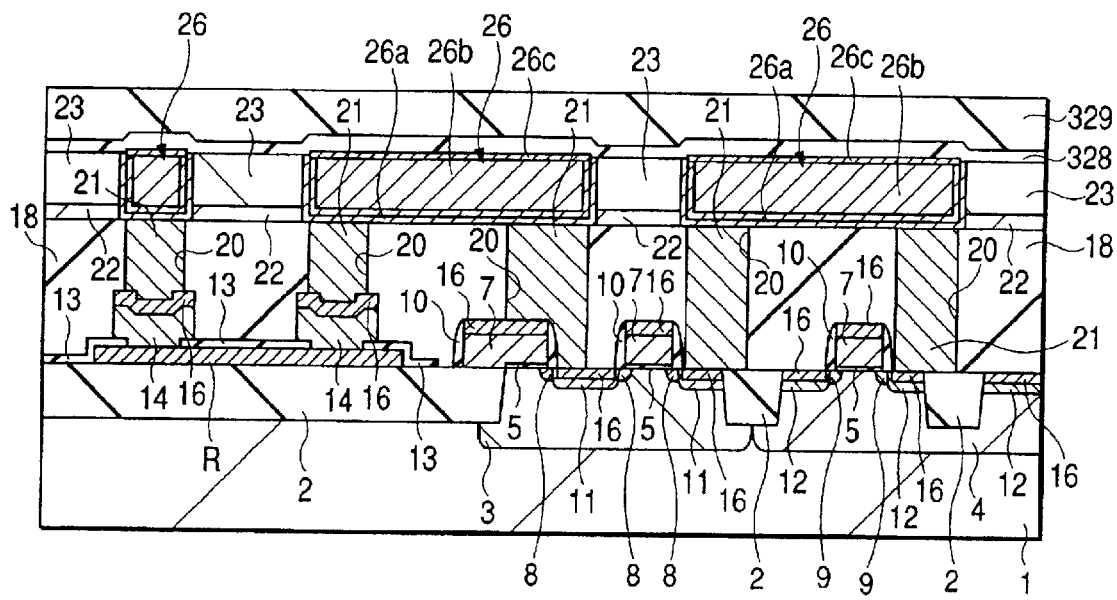
FIGS. 25a and 25b are, respectively sectional views showing steps in the manufacture of a semiconductor integrated circuit device according to Embodiment 3 of the invention.
Figure 25B:
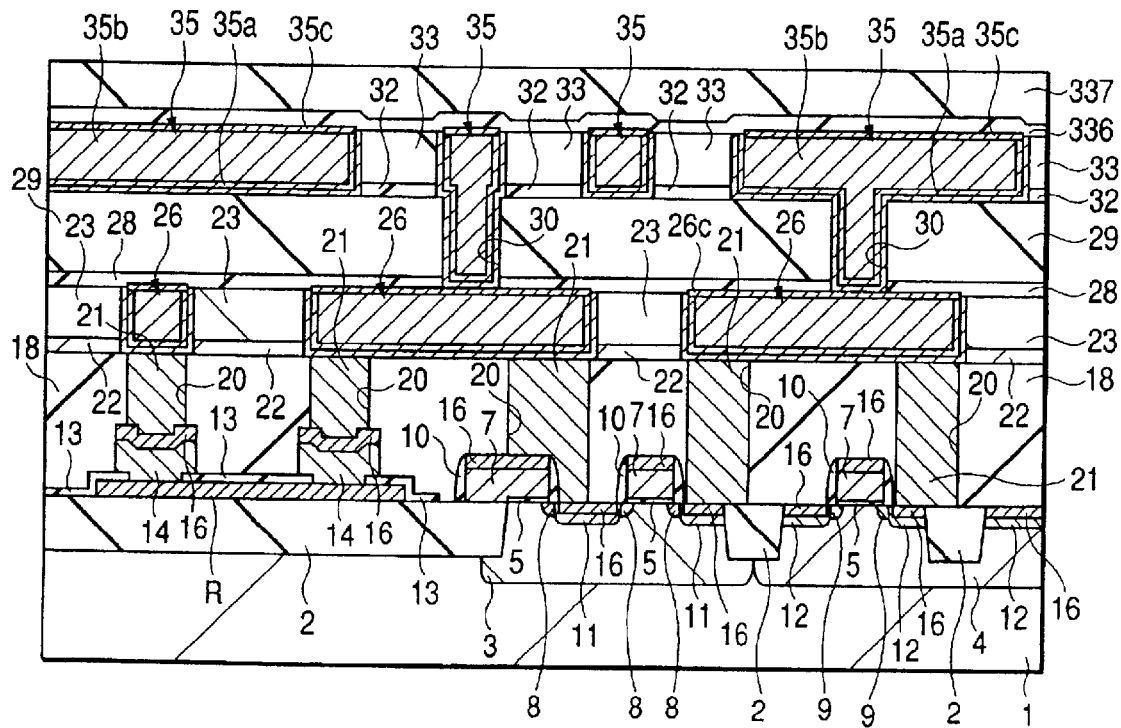

In Embodiments 1 and 2, after the formation of the tungsten films 26c, 35c (see FIGS. 7b and 9 in Embodiment 1 and FIGS. 15 and 19 in Embodiment 2), the silicon nitride films 28, 36 and the silicon oxide films 29, 37 are formed on the tungsten films 26c, 35c, respectively. Alternatively, as shown in FIGS. 25a and 25b, silicon oxide films (hereinafter referred to as TEOS film) 328, 336, which are deposited according to a CVD method using tetraethoxysilane as a starting gas, are thinly formed on the tungsten films 26c, 35c, respectively, followed by further formation thereon of insulating films 329, 337 having a dielectric constant lower than the TEOS films (i.e. a dielectric constant of 4 or below). It will be noted that a carbon-containing silicon-based insulating film, such as a silicon carbide film, an SiCO film or the like, may be used in place of the TEOS films 328, 336. The carbon-containing silicon-based insulating film, such as SiC or SiCO, has a dielectric constant as low as $\epsilon \approx 4$ to 6, and serves as a diffusion-preventing (barrier) layer for Cu, like a silicon nitride (SiN) film.

If the TEOS films 328, 336 are formed on the tungsten films 26c, 35c, respectively, the wirings 26, 35 can be protected by means of the dense TEOS films. When the insulating films 329, 337 whose dielectric constant is low are formed, high-speed operation of the semiconductor integrated circuit is ensured. When the carbon-containing silicon-based insulating films 328, 336, such as a SiC film or a SiCO film, are, respectively, formed on the tungsten films 26c, 35c, these films are lower in dielectric constant ($\epsilon \approx 4$ to 6) than a silicon nitride film and serve as a Cu diffusion barrier, like the silicon nitride film, thus resulting in high-speed operation and high reliability of the resultant semiconductor integrated circuit device.

It will be noted that the steps up to the formation of the tungsten films 26c, 35c are similar to those described with respect to Embodiment 1 or 2, and their description will not be repeated.

The steps subsequent to the formation of the insulating films 329, 337 are similar to those steps after the formation of the silicon oxide films 29, 37 in Embodiments 1 and 2, and a description thereof will not be repeated.

Embodiment 4

Figure 26A:
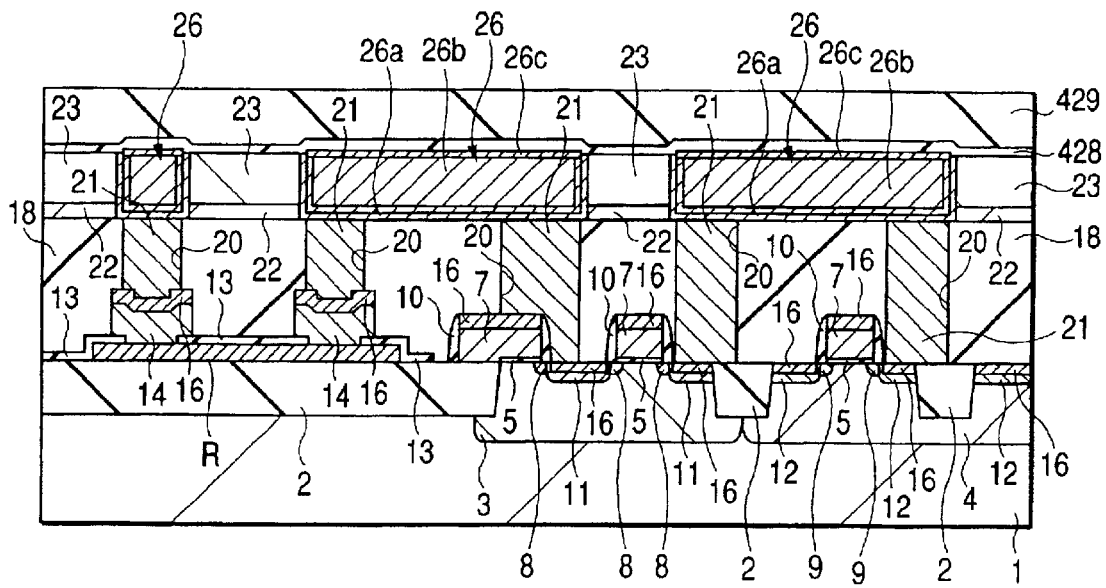
FIGS. 26a and 26b are, respectively sectional views showing steps in the manufacture of a semiconductor integrated circuit device according to Embodiment 4 of the invention.
Figure 26B:
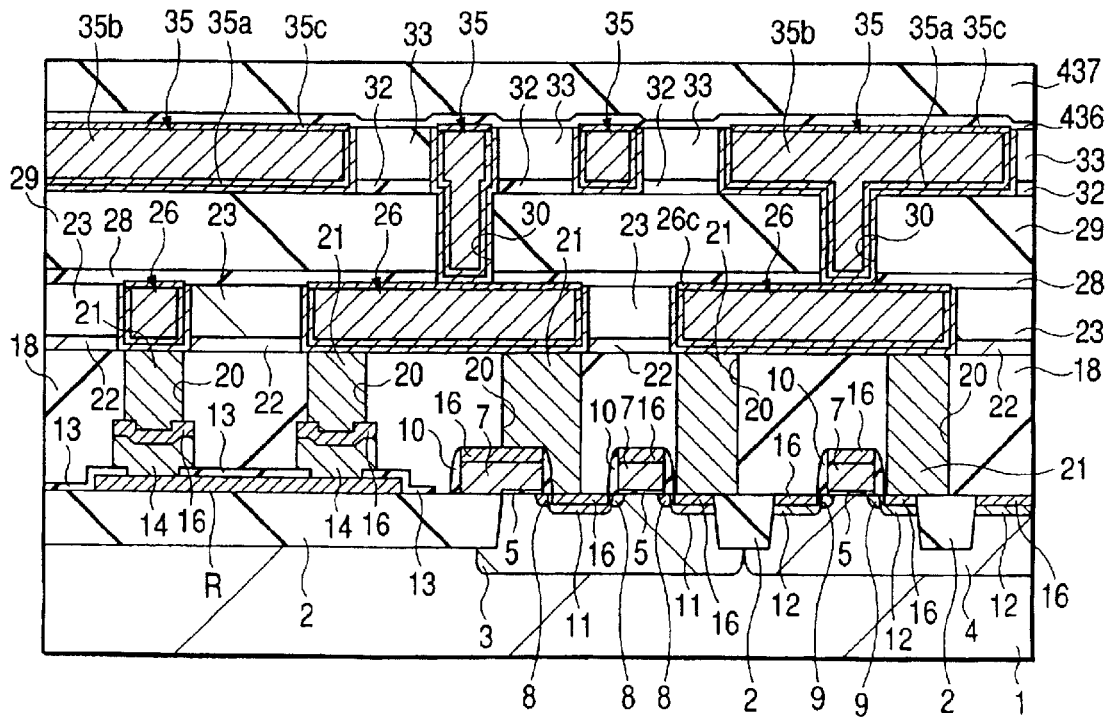

In Embodiments 1 to 3, after the formation of the tungsten films 26c, 35c (see FIGS. 7b and 9 in Embodiment 1 and FIGS. 15a and 19 in Embodiment 2), the silicon nitride films 28, 36 and the silicon oxide films 29, 37 are, respectively, formed on the tungsten films 26c, 35c. Instead, as shown in FIGS. 26a and 26b, insulating films 428, 436, which include a silicon nitride film, a PSG film, or a carbon-containing silicon-based insulating film, such as a silicon carbide (SiC) film or a SiCO film, and which have the capability of preventing diffusion of copper, may be formed on the tungsten films 26c, 35c. Moreover, insulating films 429, 437 made of a low dielectric material having a dielectric constant lower than the insulating films 428, 436 are formed on the tungsten films 26c, 35c, respectively. The insulating films 429, 437 made of the low dielectric material include, for example, those insulating films having a dielectric constant of 4 or below, such as a TEOS film, a SiOF film, an organic coating film, and a porous silica film.

The formation of the silicon nitride films 428, 436 on the tungsten films 26c, 35c can prevent copper from diffusion into the silicon nitride films 428, 436 and the TEOS films 429, 436 by means of the silicon nitride films 428, 436 even at a portion where the thickness of the tungsten films 26c, 35c is not sufficient for such prevention. Because the TEOS films 429, 437 have a dielectric constant of 4 or below and are thus relatively low in dielectric property, the dielectric constant of the insulating films as a whole can be lowered. Thus, the high-speed operation of the resulting semiconductor integrated circuit device is ensured. When using silicon carbide films or SiCO films as films 428, 436, which are a carbon-containing silicon-based insulating film, the dielectric constant of the insulating films as a whole can be lowered and such films serve as a barrier layer against diffusion of Cu. Thus, high-speed operation of the semiconductor integrated circuit device is realized with improved reliability.

It will be noted that the steps up to the formation of the tungsten films 26c, 35c are similar to those steps described with respect to Embodiment 1 or 2 and the description thereof is not repeated.

The steps subsequent to the formation of the insulating films 429, 437 made of a low dielectric material are similar to the steps after the formation of the silicon oxide films 29, 37 in Embodiments 1 and 2, and the description thereof is not repeated.

Embodiment 5

In Embodiments 1 to 4, after CMP of the copper films 26b, 35b, the tungsten films 26c, 35c are selectively or preferentially grown on the surface of the wirings 26, 35. Prior to the formation of the tungsten films 26c, 35c, the following pretreatment may be performed.

After CMP of the copper films 26b, 36b (see FIG. 7a in Embodiment 1 and FIG. 18b in Embodiment 2), the substrate surfaces (including the surfaces of the copper films 26b, 35b and the silicon oxide films 23, 33) are cleaned with a cleaning solution, such as a solution for removing foreign matter and contaminant metals, after which tungsten films 26c, 35c are formed on the wirings 26, 35 by selective or preferential growth. Such a solution should contain at least one of hydrogen fluoride (HF), citric acid, oxalic acid, hydrogen peroxide ($H_2O_2$), hydrochloric acid (HCl), sulfuric acid ($H_2SO_4$), ammonia ($NH_3$) and aminoethanol.

Figure 27A:
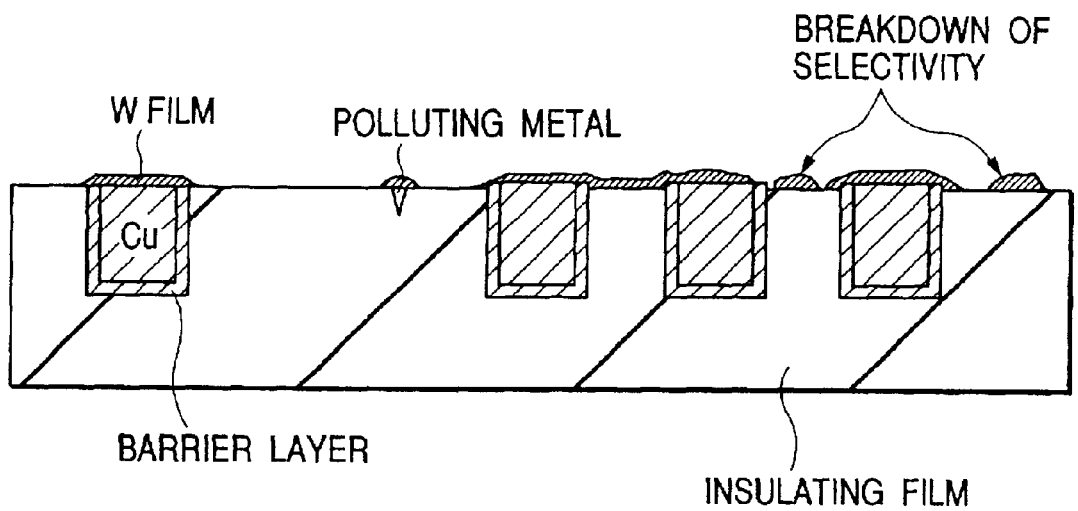
FIGS. 27a, 27b and 27c are, respectively, sectional views illustrating effects concerning Embodiments 5 and 7 of the invention.
Figure 27B:
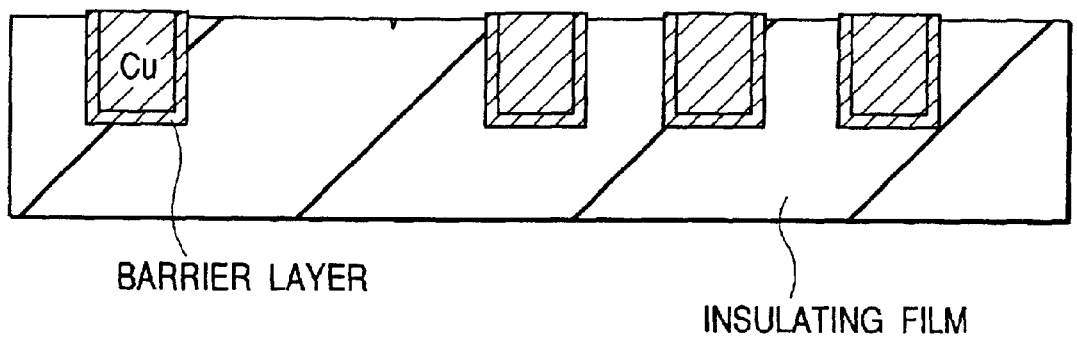
Figure 27C:
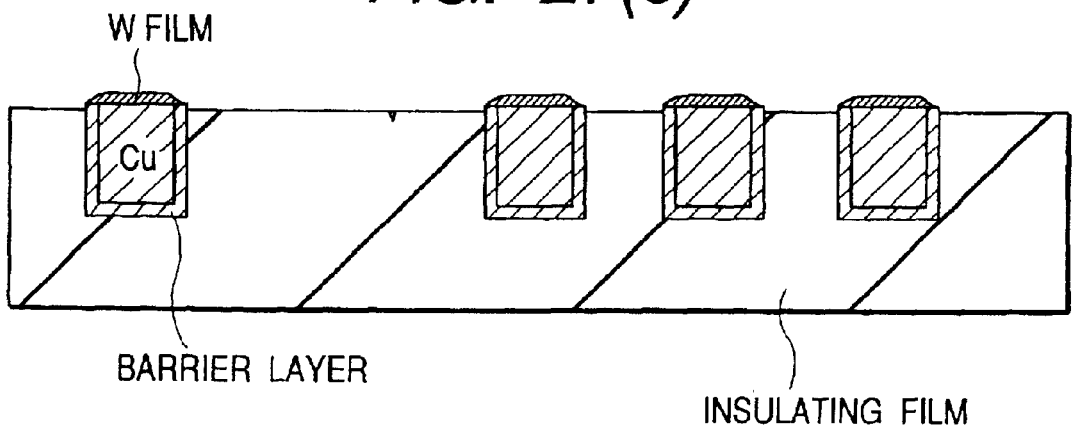

In this manner, the cleaning of the substrate surfaces with a solution containing hydrogen fluoride (HF) prior to the selective or preferential growth of the tungsten films 26c, 35c on the wirings 26, 35 results in the etching of a metallic contaminant on the silicon oxide films (FIG. 27b). Good selectivity or preferential ability is ensured thereby forming the tungsten films on the wirings 26, 35, respectively (FIG. 27c). In contrast, when a contaminant metal remains on the silicon oxide films 23, 33 after CMP of the copper films 26b, 35b and the like, the tungsten film grows on the contaminant metal, as is particularly shown in FIG. 27a.

Figure 28A:
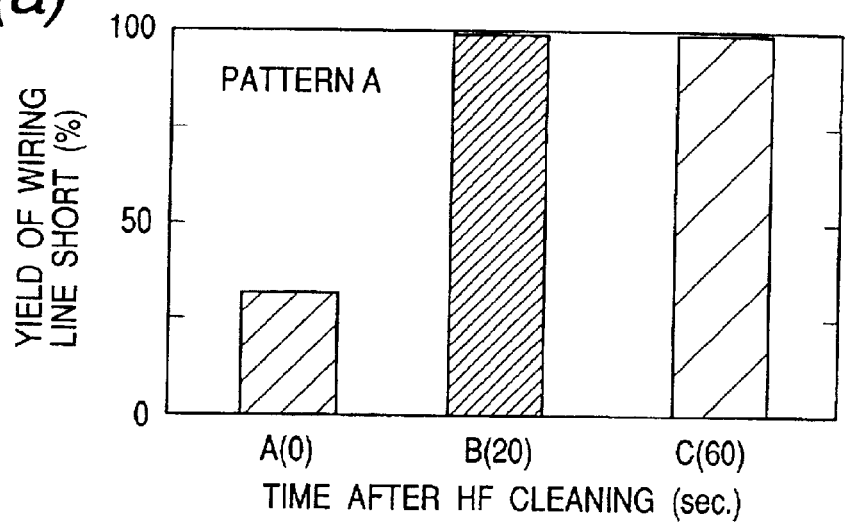

FIG. 28a is a graph showing the yield for wiring short-circuiting in the cases where cleaning with a hydrogen fluoride (HF) solution is effected for treating times of 20 seconds (B) and 60 seconds (C) and in the case where no cleaning with a hydrogen fluoride solution is effected (A).

As shown in FIG. 28a, in the case where no cleaning with a hydrogen fluoride (HF) solution is effected (A), the yield is at about 30%. In contrast, in cases where cleaning with a hydrogen fluoride (HF) solution is effected for a time of 20 seconds (B) and 60 seconds (C), the yield is at 100%. Thus, the yield including a wiring short-circuiting yield can be remarkably improved.

The pretreatment in this embodiment may be applied to the manufacture of the semiconductor integrated circuit devices described as Embodiments 1 to 4. Moreover, the pretreatment in this embodiment can remove foreign matter or contaminant metals in a case where the tungsten films 26c, 35c used as a barrier layer are not provided on the Cu wirings 26, 35, respectively, thus improving the yield, such as the wiring short-circuiting yield. More particularly, as shown in FIG. 7a, after CMP of the copper films 26b, 35b, the substrate surfaces are cleaned with a solution for removing foreign matter or contaminant metals, as in this embodiment, i.e. the solution containing at least one of HF, HCl, $H_2SO_4$, $H_2O_2$, citric acid, oxalic acid, ammonia and aminoethanol. Thereafter, as shown in FIG. 8a, the silicon nitride film 28 is formed. In this way, foreign matter and contaminant metals are removed, thereby improving the yield, such as the wiring short-circuiting yield. If the tungsten films 26c, 35c are cleaned with such a cleaning solution as mentioned above prior to and after selective growth, the yield, such as the wiring short-circuiting yield, can be further improved.

Embodiment 6

In Embodiments 1 and 2, after CMP of the copper films 26b, 35b and the like, the tungsten films 26c, 35c are selectively or preferentially grown on the surfaces of the wirings 26, 35. Prior to the formation of the tungsten films 26c, 35c, the following pretreatment may be carried out.

After completion of CMP of the copper films 26b, 35b (see FIG. 7a in Embodiment 1 and 18b in Embodiment 2), the substrate surfaces are treated with hydrogen or annealed under conditions, for example, of 430° C. and 10 Torr ($10\times1.33322\times10^2$ Pa). The hydrogen treatment may be carried out within an apparatus for the formation of the tungsten films 26c, 35c.

Thus, when the substrate surfaces are subjected to hydrogen treatment prior to the selective or preferential growth of the tungsten films 26c, 35c on the wirings 26, 35, the oxide on the wirings is reduced, and adsorbed gas, moisture and organic matter can be removed from the substrate surfaces. When hydrogen is adsorbed or occluded on or in the wiring surface, tungsten is more likely to be selectively or preferentially grown at the subsequent formation of the tungsten films 26c, 35c.

Accordingly, there can be formed highly reliable tungsten films, and adherence between the tungsten films and the copper films 26b, 35b can be improved.

Figure 28B:
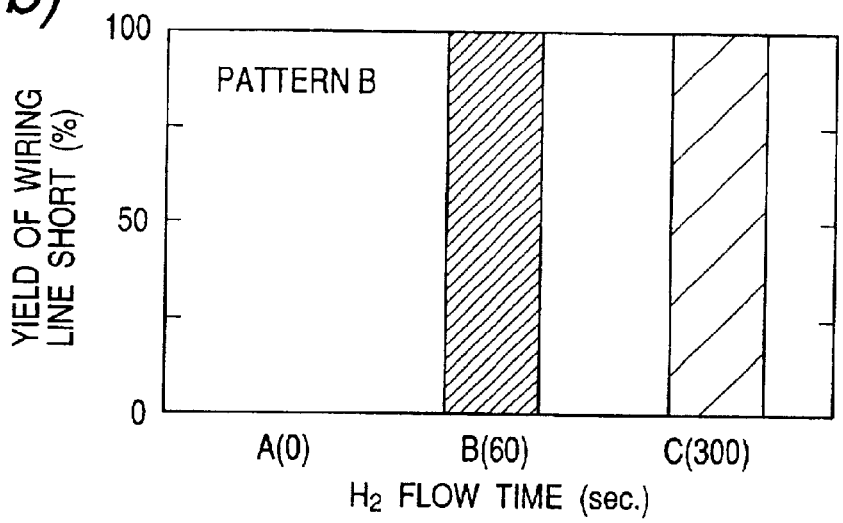
Figure 28C:
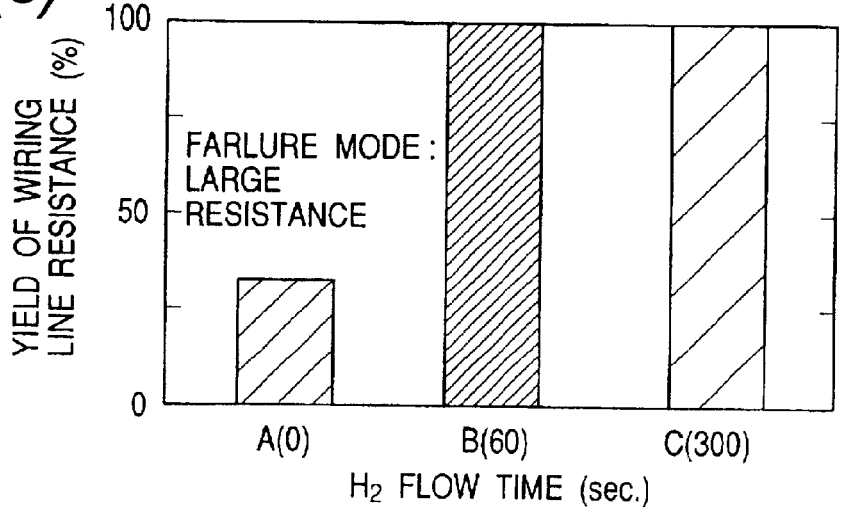

FIG. 28b is a graph showing a wiring short-circuiting yield for the cases where the hydrogen treatment is effected for a treating time of 60 seconds (B) and 300 seconds (C) and for the case where no hydrogen treatment is effected. FIG. 28c is a graph showing a wiring resistance yield. It will be noted that the growth conditions of the tungsten film include a preset temperature of 460° C., a flow rate of $WF_6$ of 7 scc., a flow rate of hydrogen of 500 scc., a pressure of 0.45 Torr ($0.45\times1.33322\times10^2$ Pa) and a treating time of 120 seconds. The cleaning treatment described for Embodiment 5 and for Embodiment 7 appearing hereinafter is used.

As shown in FIG. 28b, the case where no hydrogen treatment is effected (A), the wiring short-circuiting yield is substantially at 0%. The cases where the hydrogen treatment is effected for a treating time of 60 seconds (B) and 300 seconds (C), respectively, both have a yield of 100%. Moreover, as shown in FIG. 28c, with the case where no hydrogen treatment is effected (A), the wiring resistance yield is at approximately 30%. Where the hydrogen treatment is effected for a treating time of 60 seconds (B) and 300 seconds (C), the yield of both is 100%. Thus, the yields, such as the wiring resistance yield, can be improved. Moreover, as shown in FIG. 6b, the reliability of the Cu wiring 26 can be further improved when the hydrogen (annealing) treatment is effected after the formation of the copper film and also after CMP of the copper film. In addition, where any tungsten films 26c, 35c are not formed, the hydrogen (annealing) treatments after deposition of the copper film and after CMP of the copper film ensure more improved reliability of the Cu wiring 26.

If a similar reduction treatment is effected, e.g. an ammonia ($NH_3$) plasma treatment is effected at 360° C., after the formation of the tungsten films 26c, 35c, an adsorbed gas, moisture and organic matter can be removed from the substrate surfaces including the surface of the tungsten films 26c, 35c, thereby forming highly reliable tungsten films. Of course, the adherence with an insulating film, such as a silicon nitride film, formed on the tungsten films 26c, 35c can be improved. It will be noted that this reduction treatment may be carried out within the same apparatus as used for the formation of the insulating film.

The pretreatment in this embodiment can be applied to the manufacture of the semiconductor integrated circuit devices of Embodiments 3 to 5.

If the cleaning treatment illustrated in Embodiment 5 and the reduction treatment of this embodiment are used in combination for the manufacture of the semiconductor integrated circuit devices of Embodiments 1 to 4, the yields can be further improved, with more improved reliability of the wirings. More particularly, when the hydrogen (annealing) treatment, after deposition of the copper film, and the cleaning treatment, which has been described with respect to Embodiment 5, after CMP of the copper film, are performed, when the hydrogen (annealing) treatment is effected, the reliability of the Cu wiring can be further improved.

Embodiment 7

After the selective or preferential growth of the tungsten films 26c, 35c on the wiring surface, the following after-treatment may be carried out.

After the selective or preferential growth of the tungsten films 26c, 35c on the surfaces of the wirings 26, 35 (sec FIGS. 7b and 9 in Embodiment 1 and FIGS. 15a and 19 in Embodiment 2), the substrate surfaces (including the surfaces of the tungsten films 26c, 35c and the silicon oxide films 23, 33, and the like) are cleaned with a solution capable of removing contaminant metals and containing at least one of hydrogen fluoride (HF), hydrogen peroxide ($H_2O_2$), citric acid and the like, as mentioned hereinbefore.

When the substrate surfaces are cleaned with a hydrogen fluoride (HF) solution or the like after the selective or preferential growth of the tungsten films 26c, 35c, a tungsten film is grown on the silicon oxide film (i.e. breakage of the selectivity occurs) as shown in FIG. 27a. If a tungsten film is grown on a contaminant metal on the silicon oxide film as described with reference to Embodiment 5, the unnecessary tungsten film and contaminant metal are etched, thereby providing a highly reliable tungsten film.

For the removal of the unnecessary tungsten film, CMP may be used. While the tungsten film formed on a wiring is a relatively thick and continuous film, a tungsten film formed on an insulating film is discontinuous and thin, so that only the tungsten film on the insulating film can be removed.

The after-treatment in this embodiment can be applied in the manufacture of the semiconductor integrated circuit devices of Embodiments 1 to 6.

When the pretreatment of Embodiment 5 or 6 and the after-treatment of this embodiment are used in combination for the manufacture of the semiconductor integrated circuit devices of Embodiments 1 to 4, the yield and reliability of the wiring can be further improved.

Moreover, when the cleaning treatment of Embodiment 5, the reduction treatment of Embodiment 6 and the after-treatment of this embodiment are used in combination for the manufacture of the semiconductor circuit devices of Embodiments 1 to 4, the yield and reliability of the wiring can be further improved.

The invention made by us has been particularly described based on various embodiments, which should not be construed as limiting the invention. Many alterations and modifications may be possible within the scope of the invention.

Especially, in the foregoing embodiments, a copper wiring (copper film 26b) is used, however, the wiring may be made of, aside from copper, silver, aluminium or an alloy mainly comprised of these metals. The copper alloys include an alloy having a Mg content of 5% or below, or an alloy having an Al content of 3% or below.

Figure 30A:
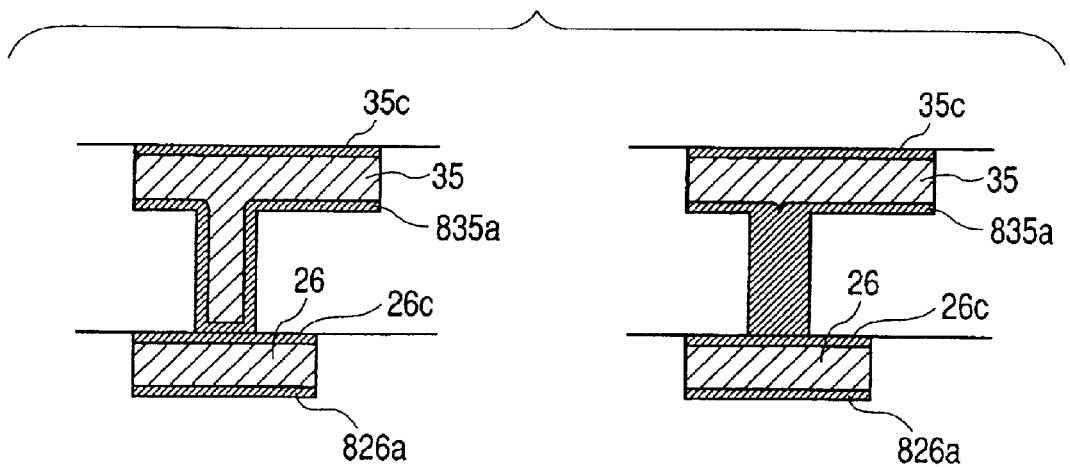
FIGS. 30a, 30b and 30c are, respectively, sectional views showing steps in the manufacture of a semiconductor integrated circuit device according to another embodiment of the invention.
Figure 30B:
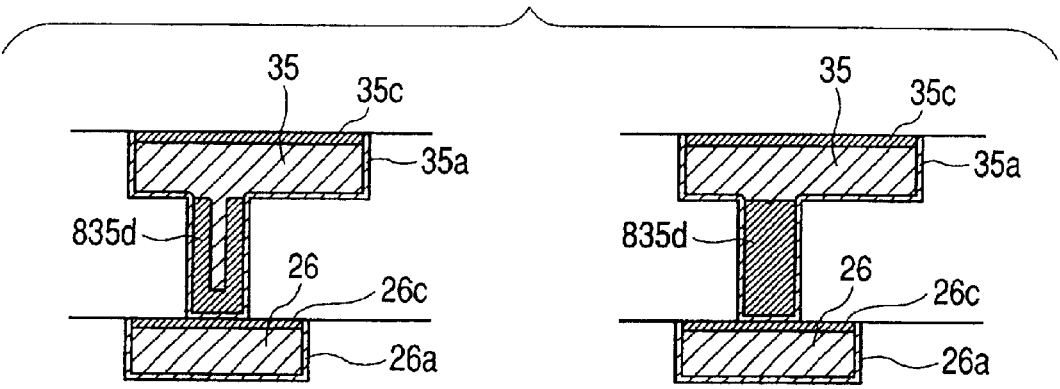
Figure 30C:
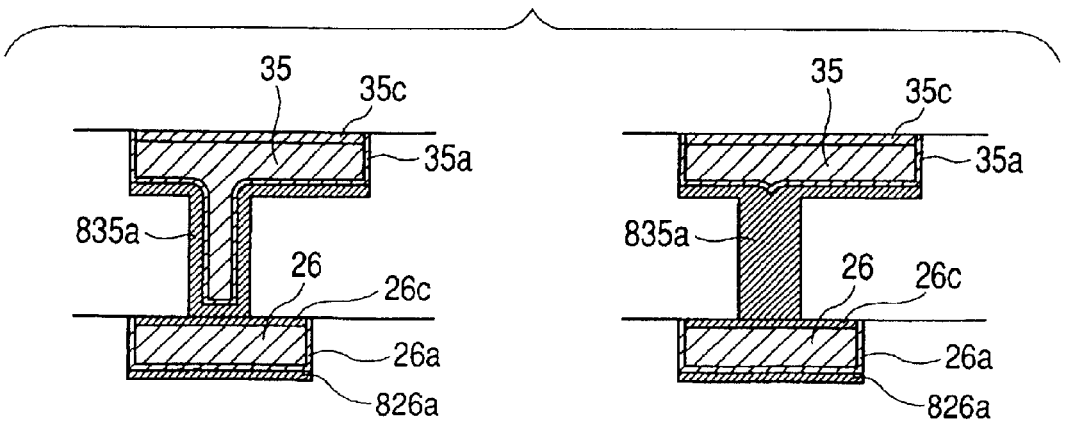

In the foregoing embodiments, the copper films 26b, 35b are formed on the barrier layers 26a, 35a, respectively. As shown in FIGS. 30(a) to 30(c), many alterations and combinations are possible including (a) tungsten films 826a, 835a left only at the bottom of the wiring groove, (b) tungsten film 835d formed further on the barrier film 35a, and (c) barrier layers 26a, 35a further formed on the tungsten films 826a, 835a indicated in (a) above.

The effects, advantages and features attained by typical embodiments of the invention disclosed herein are briefly described below.

According to the method of manufacture of a semiconductor integrated circuit device of the invention, a cap conductive film is selectively or preferentially grown on a wiring, thus leading to a high-speed operation of the semiconductor integrated circuit device.

Occurrence of electromigration and stress migration can be suppressed and thus, the wiring life can be elongated.

Moreover, when the contact hole formed on the wiring is etched at the bottom thereof, the underlying wiring can be prevented from direct sputtering, so that the breakdown voltage can be improved, with a reduced leakage current.

If the contact hole is shifted relative to the wiring, contact can be maintained, with a reduction in the number of contact failures.

The oxidation of a wiring surface can be suppressed, thereby reducing a rise in the wiring resistance.

If a pretreatment is effected, e.g. the substrate surfaces are cleaned with a solution containing HF (hydrogen fluoride) or the like, or the substrate surfaces are treated with hydrogen, prior to the formation of the cap conductive film, there can be formed a highly reliable cap conductive film. When the substrate surf aces are cleaned with a solution containing hydrogen fluoride (HF) or hydrogen peroxide ($H_2O_2$) after formation of the cap conductive film, a highly reliable cap conductive film can be formed.

The semiconductor integrated circuit device of the invention is formed with a cap conductive film on a wiring, so that high-speed operation thereof is realized.

Electromigration or stress migration is suppressed from occurring, and thus, an elongated wiring life is ensured.

Moreover, when the contact hole formed on the wiring is etched at the bottom thereof, the underlying wiring can be prevented from direct sputtering, so that the breakdown voltage can be improved, with a reduced leakage current.

If the contact hole is shifted relative to the wiring, contact can be maintained, with a reduction in the number of contact failures.

The oxidation of a wiring surface can be suppressed, thereby reducing the rise of the wiring resistance.

What is claimed is:

1. A method for manufacturing a semiconductor integrated circuit device, comprising the steps of:

(a) forming a groove for wiring in a first insulating film formed on a semiconductor substrate;

(b) successively forming a barrier layer and a conductive film over said first insulating film including the inside of said groove for wiring and removing said barrier layer and said conductive film from outside of said groove for wiring by polishing, thereby forming a wiring;

(c) cleaning a surface of said first insulating film to remove conductive film that remains on said first insulating film in said step (b), and to improve plating selectivity and ability for preferential growth;

(d) forming a cap conductive film on said wiring by selective growth or preferential growth of said cap conductive film on said wiring;

(e) cleaning a surface of said first insulating film after said step (d) to remove undesired cap conductive film grown on the surface of said first insulating film; and (f) forming a second insulating film over said cap conductive film and said first insulating film.

2. A method for manufacturing a semiconductor integrated circuit device, comprising the steps of:

(a) forming a groove for wiring in a first insulating film formed on a semiconductor substrate;

(b) successively forming a barrier layer and a conductive film over said first insulating film including the inside of said groove for wiring and removing said barrier layer and said conductive film from outside of said groove for wiring by polishing, thereby forming a wiring;

(c) cleaning a surface of said first insulating film to remove conductive film that remains on said first insulating film in said step (b), and to improve plating selectivity and ability for preferential growth;

(d) forming a cap conductive film on said wiring in self-alignment with said wiring by selective growth or preferential growth of said cap conductive film on said wiring;

(e) cleaning a surface of said first insulating film after said step (d) to remove undesired cap conductive film grown on the surface of said first insulating film;

(f) forming a second insulating film over said cap conductive film and said first insulating film;

(g) partly removing said second insulating film on said wiring to form an opening so that said cap conductive film is exposed; and (h) forming a second conductive film in said opening.

3. A method for manufacturing a semiconductor integrated circuit device, comprising the steps of:

(a) forming a first wiring on a semiconductor substrate;

(b) forming a first insulating film on said first wiring;

(c) removing said first insulating film at a portion thereof corresponding to a contact region of said first wiring to form a contact hole;

(d) forming a first conductive film over said first insulating film including the inside of said contact hole;

(e) removing said first conductive film from outside of said contact hole to form a plug;

(f) forming a second insulating film over said first insulating film and said plug;

(g) removing said second insulating film at a portion thereof corresponding to a region where a second wiring is to be formed, thereby forming a groove for wiring;

(h) successively forming a barrier layer and a second conductive film on said second insulating film including the inside of the said groove for wiring;

(i) removing said barrier layer and said second conductive film from outside of said groove for wiring by polishing to form a second wiring;

(j) cleaning a surface of said second insulating film to remove said second conductive film that remains on said second insulating film in said step (i), and to improve plating selectivity and ability for preferential growth;

(k) forming a cap conductive film on said second wiring in self-alignment with said second wiring by selective growth or preferential growth of said cap conductive film on said second wiring;

(l) cleaning a surface of said second insulating film after said step (k) to remove undesired cap conductive film grown on the surface of said second insulating film; and (m) forming a third insulating film over said cap conductive film and said second insulating film.

4. A method for manufacturing a semiconductor integrated circuit device, comprising the steps of:

(a) forming a first wiring on a semiconductor substrate;

(b) successively forming a first insulating film and a second insulating film on said first wiring;

(c) removing said first insulating film and said second insulating film at a portion thereof corresponding to a contact region of said first wiring to form a contact hole;

(d) removing said second insulating film at a portion thereof corresponding to a region where a second wiring is to be formed thereby forming a groove for wiring;

(e) successively forming a barrier layer and a conductive film on said second insulating film including said contact hole and the inside of the said groove for wiring;

(f) removing said barrier layer and said conductive film from outside of said contact hole and said groove for wiring by polishing to form a second wiring and a connection between said first wiring and said second wiring;

(g) cleaning a surface of said second insulating film to remove said second conductive film that remains on said second insulating film in said step (f), and to improve plating selectivity and ability for preferential growth;

(h) forming a cap conductive film on said second wiring in self-alignment with said second wiring by selective growth or preferential growth of said cap conductive film on said second wiring;

(i) cleaning a surface of said second insulating film after said step (h) to remove undesired cap conductive film grown on the surface of said second insulating film; and (j) forming a third insulating film over said cap conductive film and said second insulating film.

5. A method for manufacturing a semiconductor integrated circuit device, comprising the steps of:

(a) forming a first wiring on a semiconductor substrate;

(b) successively forming a first insulating film and a second insulating film on said first wiring;

(c) removing said second insulating film at a portion thereof corresponding to a region where a second wiring is to be formed to form a groove for wiring;

(d) removing said first insulating film at a portion thereof corresponding to a contact region of said first wiring thereby forming a contact hole;

(e) successively forming a barrier layer and a conductive film on said second insulating film including said contact hole and the inside of the said groove for wiring;

(f) removing said barrier layer and said conductive film from outside of said contact hole and said groove for wiring by polishing to form a second wiring and a connection between said first wiring and said second wiring;

(g) cleaning a surface of said second insulating film to remove said second conductive film that remains on said second insulating film in said step (f), and to improve plating selectivity and ability for preferential growth;

(h) forming a cap conductive film on said second wiring in said self-alignment with said second wiring by selective growth or preferential growth of said cap conductive film on said second wiring;

(i) cleaning a surface of said second insulating film after said step (h) to remove undesired cap conductive film grown on the surface of said second insulating film; and (j) forming a third insulating film over said cap conductive film and said second insulating film.

6. A method for manufacturing a semiconductor integrated circuit device according to claim 4 or 5 further comprising the steps of:

partly removing said third insulating film to form an opening so that said cap conductive film is exposed;

burying a conductive material in said opening to form a plug; and forming an upper wiring, which extends on said plug, on said third insulating film.

7. A method for manufacturing a semiconductor integrated circuit device according to claim 3, 4 or 5, wherein said second wiring is made of copper, silver, aluminum or an alloy containing these metals as a main component.

8. A method for manufacturing a semiconductor integrated circuit device according to claim 1, wherein said cap conductive film is a film made of W.

9. A method for manufacturing a semiconductor integrated circuit device according to claim 1, wherein said cap conductive film is a film made of WN, TiN, Ta, TaN or Ni.

10. A method for manufacturing a semiconductor integrated circuit device according to claim 1, wherein said cap conductive film is formed at a pressure of 1 Torr ($1 \times 1.33322 \times 10^2$ Pa) or below.

11. A method for manufacturing a semiconductor integrated circuit device according to claim 1, wherein said second insulating film is formed by the steps of:

(a) forming a TEOS film or a carbon-containing silicon-based insulating film on said cap conductive film; and (b) forming, on said TEOS film or said carbon-containing silicon-based insulating film, a film whose dielectric constant is lower than that of said TEOS film or said carbon-containing silicon-based insulating film.

12. A method for manufacturing a semiconductor integrated circuit device according to claim 1, wherein said second insulating film is formed by the steps of:

(a) forming, on said cap conductive film, a diffusion-preventing insulating film for preventing the diffusion of a conductor material constituting said cap conductive film; and (b) forming, on said diffusion-preventing insulating film, a low dielectric insulating film whose dielectric constant is lower than said diffusion-preventing insulating film.

13. A method for manufacturing a semiconductor integrated circuit device according to claim 12, wherein said diffusion-preventing insulating film is made of a silicon nitride film, a PSG film, or a carbon-containing silicon-based insulating film including a silicon carbide (SiC) film or a SiCO film.

14. A method for manufacturing a semiconductor integrated circuit device according to claim 12, wherein said low dielectric insulating film includes at least one of a TEOS film, a fluorine-containing silicon oxide film such as SiOF film, a carbon-containing silicon-based insulating film such as SiOC, an organic insulating film and a porous silica film.

15. A method for manufacturing a semiconductor integrated circuit device according to claim 1, wherein said cleaning in said step (c) is performed by using a solution containing at least one of hydrogen fluoride (HF), citric acid, oxalic acid, hydrogen peroxide ($H_2O_2$), hydrochloric acid (HCl), sulfuric acid ($H_4SO_4$), ammonia ($NH_3$) and aminoethanol.

16. A method for manufacturing a semiconductor integrated circuit device according to claim 1, wherein said step (c) includes a sub-step of treating substrate surfaces with hydrogen.

17. A method for manufacturing a semiconductor integrated circuit device according to claim 1, wherein said step (e) is performed by using a solution containing at least one of hydrogen fluoride (HF), hydrogen peroxide ($H_2O_2$) and citric acid after the selective growth or preferential growth of said cap conductive film.

18. A method for manufacturing a semiconductor integrated circuit device according to claim 1, wherein said cap conductive film is selectively formed on said wiring by a selective CVD (chemical vapor deposition) method, and said conductive film is constituted of a copper film.

19. A method for manufacturing a semiconductor integrated circuit device, comprising the steps of:

(a) forming a groove in a first insulating film formed on a semiconductor substrate;

(b) depositing a first conductive film comprising copper as a main component thereof on said first insulating film including the groove;

(c) removing said first conductive film from outside of said groove by polishing to bury said first conductive film in said groove;

(d) cleaning with a solution capable of removing a foreign matter or a contaminant metal from a surface of said first insulating film to remove said contaminant metal that remains on a surface of said first insulating film in said step (c), and to improve plating selectivity and ability for preferential growth;

(e) forming a cap conductive film on said first conductive film in said groove in self-alignment with said first conductive film by selective growth of the cap conductive film on said first conductive film buried in said groove by a selective CVD (chemical vapor deposition) method; and (f) cleaning a surface of said first insulating film with a solution capable of removing a foreign matter or a contaminant metal after said step (e) to remove undesired cap conductive film grown on the surface of said first insulating film.

20. A method for manufacturing a semiconductor integrated circuit device according to claim 19, wherein said cleaning in said step (d) is a cleaning with a solution containing at least one of hydrogen fluoride (HF), citric acid, oxalic acid, hydrogen peroxide ($H_2O_2$), hydrochloric acid (HCl), sulfuric acid, ammonia ($NH_3$) and aminoethanol.

21. A method for manufacturing a semiconductor integrated circuit device according to claim 19, wherein said cap conductive film is made of a tungsten film.

22. A method for manufacturing a semiconductor integrated circuit device, comprising the steps of:
    (a) forming a groove in a first insulating film formed on a semiconductor substrate;
    (b) depositing a copper film on said first insulating film including the groove;
    (c) removing said copper film from outside of said groove to bury said copper film in said groove;
    (d) cleaning with a solution capable of removing a foreign matter or a contaminant metal from a surface of said first insulating film to remove said contaminant metal that remains on a surface of said first insulating film after said step (c), and to improve plating selectivity and ability for preferential growth;
    (e) forming a cap conductive film on said copper film in said groove by selective growth of the cap conductive film on said copper film buried in said groove; and
    (f) cleaning the resultant semiconductor substrate with a solution capable of removing a foreign matter or a contaminant metal to remove undesired cap conductive film grown on the surface of said first insulating film.

23. A method for manufacturing a semiconductor integrated circuit device according to claim 22, further comprising, after the step of (d), treating said copper film with hydrogen.

24. A method for manufacturing a semiconductor integrated circuit device according to claim 23, further comprising, between the steps of (b) and (c), treating said copper film with hydrogen.

25. A method for manufacturing a semiconductor integrated circuit device, comprising the steps of:
    (a) forming a groove in a first insulating film formed on a semiconductor substrate;
    (b) depositing a copper film on said first insulating film including the groove;
    (c) removing said copper film from outside of said groove to bury said copper film in said groove;
    (d) treating said copper film with hydrogen;
    (e) cleaning with a solution capable of removing a foreign matter or a contaminant metal from a surface of said first insulating film to remove said contaminant metal that remains on a surface of said first insulating film, and to improve plating selectivity and ability for preferential growth;
    (f) forming a cap conductive film on said copper film in said groove by selective growth of the cap conductive film on said copper film buried in said groove;
    (g) cleaning the resultant semiconductor substrate with a solution capable of removing a foreign matter or a contaminant metal to remove undesired cap conductive film grown on the surface of said first insulating film; and
    (h) treating the copper film, buried in said groove, with ammonia ($NH_3$).

26. A method for manufacturing a semiconductor integrated circuit device, comprising the steps of:
    (a) forming a groove in a first insulating film formed on a semiconductor substrate;
    (b) depositing a copper film on said first insulating film including the groove;
    (c) removing said copper film from outside of said groove to bury said copper film in said groove;
    (d) after the step of (c), cleaning with a solution capable of removing a foreign matter or a contaminant metal, and to improve plating selectivity and ability for preferential growth;
    (e) after the step of (c), treating said copper film with hydrogen;
    (f) forming a cap conductive film on said copper film in said groove by selective growth of the cap conductive film on said copper film buried in said groove; and
    (g) cleaning the resultant semiconductor substrate with a solution capable of removing a foreign matter or a contaminant metal to remove undesired cap conductive film grown on the surface of said first insulating film.

27. A method for manufacturing a semiconductor integrated circuit device according to claim 26, wherein the step of (e) is carried out after the step of (d).

28. A method for manufacturing semiconductor integrated circuit device according to claim 4, said cleaning in said step (g) is performed by using a solution containing at least one of hydrogen fluoride (HF), citric acid, oxalic acid, hydrogen peroxide ($H_2O_2$), hydrochloric acid (HCl), sulfuric acid ($H_4SO_4$), ammonia ($NH_3$) and aminoethanol.

29. A method for manufacturing semiconductor integrated circuit device according to claim 5, said cleaning in said step (g) is performed by using a solution containing at least one of hydrogen fluoride (HF), citric acid, oxalic acid, hydrogen peroxide ($H_2O_2$), hydrochloric acid (HCl), sulfuric acid ($H_4SO_4$), ammonia ($NH_3$) and aminoethanol.

30. A method for manufacturing semiconductor integrated circuit device according to claim 4, wherein said step (i) is performed by using a solution containing hydrogen fluoride (HF), hydrogen peroxide ($H_2O_2$), or a solution capable of removing foreign matters or a contaminant metal after the selective growth or preferential growth.

31. A method for manufacturing semiconductor integrated circuit device according to claim 5, wherein said step (i) is performed by using a solution containing hydrogen fluoride (HF), hydrogen peroxide ($H_2O_2$), or a solution capable of removing foreign matters or a contaminant metal after the selective growth or preferential growth.

32. A method for manufacturing a semiconductor integrated circuit device according to claim 1, further comprising the steps of:
    (a) partly removing said second insulating film to form an opening so that said cap conductive film is exposed;
    (b) burying a conductive material in said opening to form a plug; and
    (c) forming an upper wiring, which extends on said plug, on said second insulating film.

33. A method for manufacturing a semiconductor integrated circuit device according to claim 1, wherein said wiring is made of copper, silver, aluminum or an alloy containing these metals as a main component.

34. A method for manufacturing a semiconductor integrated circuit device according to claim 2, wherein said wiring is made of copper, silver, aluminum or an alloy containing these metals as a main component.

35. A method for manufacturing a semiconductor integrated circuit device, comprising the steps of:
    (a) forming a groove in a first insulating film formed on a semiconductor substrate;

(b) depositing a copper film on said first insulating film including the groove;
(c) removing said copper film from outside of said groove to bury said copper film in said groove;
(d) cleaning with a solution capable of removing a foreign matter or a contaminant metal from a surface of said first insulating film to remove said contaminant metal that remains on a surface of said first insulating film, the solution containing at least one of hydrogen fluoride (HF), citric acid, oxalic acid, hydrogen peroxide ($H_2O_2$), hydrochloric acid (HCl), sulfuric acid ($H_4SO_4$) and ammonia ($NH_3$);
(e) forming a cap conductive film on said copper film in said groove by selective growth of the cap conductive film on said copper film buried in said groove; and
(f) cleaning the resultant semiconductor substrate with a solution capable of removing foreign matter or a contaminant metal to remove undesired cap conductive film grown on the surface of said first insulating film, that solution containing hydrogen fluoride (HF), hydrogen peroxide ($H_2O_2$), or a solution capable of removing foreign matters or a contaminant metal after the selective growth or preferential growth.

* * * * *